US012780846B2

(12) United States Patent
Shin et al.

(10) Patent No.: US 12,780,846 B2
(45) Date of Patent: *Nov. 3, 2026

(54) POLYCYCLIC COMPOUND AND ORGANOELECTRO LUMINESCENT DEVICE USING SAME

(71) Applicant: SFC CO., LTD, Cheongju-si (KR)

(72) Inventors: Bong-ki Shin, Cheongju-si (KR); Sung-hoon Joo, Cheongju-si (KR); Byung-sun Yang, Cheongju-si (KR); Ji-hwan Kim, Cheongju-si (KR); Hyeon-jun Jo, Cheongju-si (KR); Sung-eun Choi, Cheongju-si (KR)

(73) Assignee: SFC CO., LTD., Cheongju-si (KR)

( * ) Notice: Subject to any disclaimer, the term of this patent is extended or adjusted under 35 U.S.C. 154(b) by 940 days.

This patent is subject to a terminal disclaimer.

(21) Appl. No.: 17/772,597

(22) PCT Filed: Nov. 2, 2020

(86) PCT No.: PCT/KR2020/015133

§ 371 (c)(1),
(2) Date: Apr. 28, 2022

(87) PCT Pub. No.: WO2021/086148

PCT Pub. Date: May 6, 2021

(65) Prior Publication Data

US 2023/0008756 A1 Jan. 12, 2023

(30) Foreign Application Priority Data

Oct. 31, 2019 (KR) ........................ 10-2019-0137294

(51) Int. Cl.
*C07F 5/02* (2006.01)
*H10K 85/60* (2023.01)

(52) U.S. Cl.
CPC ........... *C07F 5/027* (2013.01); *H10K 85/658* (2023.02)

(58) Field of Classification Search
CPC ...... C07F 5/027; H10K 85/322; H10K 85/658
See application file for complete search history.

(56) References Cited

U.S. PATENT DOCUMENTS

2018/0069182 A1* 3/2018 Hatakeyama et al. .. H01L 51/00

FOREIGN PATENT DOCUMENTS

| | | | | | |
|---|---|---|---|---|---|
| CN | 107417715 | A | | 12/2017 | |
| CN | 107793441 | A | | 3/2018 | |
| CN | 107851724 | A | | 3/2018 | |
| CN | 110225917 | A | | 9/2019 | |
| KR | 10-2017-0030427 | A | | 3/2017 | |
| KR | 10-2017-0130434 | A | | 11/2017 | |
| KR | 10-2017-0130435 | A | | 11/2017 | |
| KR | 10-2018-0122298 | A | | 11/2018 | |
| KR | 10-2018-0127918 | A | | 11/2018 | |
| KR | 20180127918 | A | * | 11/2018 | ................ C07F 5/02 |
| KR | 10-2020-0070141 | A | | 6/2020 | |
| WO | WO 2018/186404 | A1 | | 10/2018 | |
| WO | WO 2018/216990 | A1 | | 11/2018 | |

OTHER PUBLICATIONS

KR 20180127918A (Lee et al., IDS reference, English language machine translation) (Year: 2018).*
Adv. Mater. 2016, 28, 2777-2781 (Hatakeyama-2 et al.) (Year: 2016).*
Angew. Chem. Int. Ed. 2017, 56, 5087-5090 (Year: 2017).*
Chem. Eur. J. 2019, 25, 2423-2441 (Liu et al.) (Year: 2019).*
Chinese Office Action issued on Oct. 8, 2023, in counterpart Chinese Patent Application No. 202080090731.3 (6 pages in Chinese).
International Search Report issued on Feb. 17, 2021, in counterpart PCT Patent Application No. PCT/KR2020/015133 (3 pages in Korean).
Korean Office Action Issued on Feb. 22, 2021, in Counterpart Korean Patent Application No. 10-2020-0144334 (8 Pages in English, 8 Pages in Korean).
Korean Notice of Allowance Issued on Jan. 7, 2022, in Counterpart Korean Patent Application No. 10-2020-0144334 (2 Pages in English, 2 Pages in Korean).

* cited by examiner

*Primary Examiner* — Amy C Bonaparte
*Assistant Examiner* — Derek Rhoades
(74) *Attorney, Agent, or Firm* — NSIP Law

(57) ABSTRACT

The present invention relates to a novel polycyclic compound employed in an organic layer of an organoelectro luminescent device, wherein the organoelectro luminescent device employing the compound according to the present invention has remarkably improved luminous efficiency. According to the present invention, it is possible to implement a highly efficient organoelectro luminescent device that can be effectively applied to various display devices.

16 Claims, No Drawings

POLYCYCLIC COMPOUND AND ORGANOELECTRO LUMINESCENT DEVICE USING SAME

CROSS REFERENCE TO RELATED APPLICATIONS

This application is a U.S. National Stage Application of International Application No. PCT/KR2020/015133, filed on Nov. 2, 2020, which claims the benefit under 35 USC 119 (a) and 365(b) of Korean Patent Application No. 10-2019-0137294, filed on Oct. 31, 2019 in the Korean Intellectual Property Office, the entire disclosure of which is incorporated herein by reference for all purposes.

TECHNICAL FIELD

The present invention relates to polycyclic compounds and an organic electroluminescent device with high performance using at least one of the polycyclic compounds.

BACKGROUND ART

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers, such as hole injecting materials, hole transport materials, light emitting materials, electron transport materials, electron injecting materials, and electron blocking materials. However, more research still needs to be done to develop structurally optimized organic layers for organic electroluminescent devices and stable and efficient materials for organic layers of organic electroluminescent devices.

As such, there is a continued need to develop structures of organic electroluminescent devices optimized to improve their luminescent properties and new materials capable of supporting the optimized structures of organic electroluminescent devices.

DETAILED DESCRIPTION OF THE INVENTION

Problems to be Solved by the Invention

Accordingly, the present invention intends to provide polycyclic compounds that can be employed in organic layers of organic electroluminescent devices to achieve high performance of the devices. The present invention also intends to provide an organic electroluminescent device including at least one of the polycyclic compounds.

Technical Solution

One aspect of the present invention provides compounds represented by Formulae A, B, and C:

[Formula A]

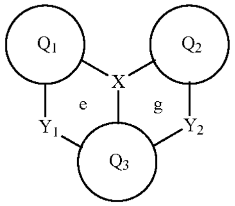

[Formula B]

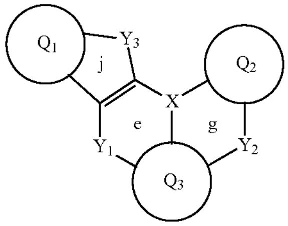

[Formula C]

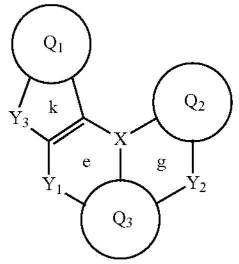

More specific structures of Formulae A, B, and C, definitions of the substituents in Formulae A, B, and C, and specific polycyclic compounds that can be represented by Formulae A, B, and C are described below.

A further aspect of the present invention provides an organic electroluminescent device including a first electrode, a second electrode opposite to the first electrode, and one or more organic layers interposed between the first and second electrodes wherein one of the organic layers includes at least one of the polycyclic compounds represented by Formulae A, B, and C.

Effects of the Invention

The polycyclic compounds of the present invention can be employed in organic layers of organic electroluminescent devices to achieve high performance of the devices.

BEST MODE FOR CARRYING OUT THE INVENTION

The present invention will now be described in more detail.

The present invention is directed to polycyclic compounds represented by Formulae A, B, and C:

[Formula A]

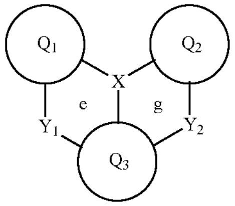

-continued

[Formula B]

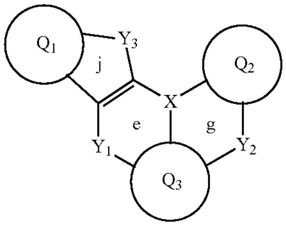

[Formula C]

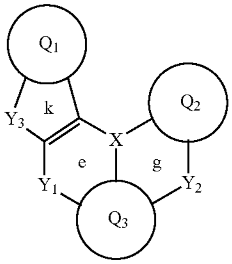

wherein $Q_1$ to $Q_3$ are identical to or different from each other and are each independently a 3 to 8-membered monocyclic or polycyclic substituted or unsubstituted aliphatic, aromatic or non-aromatic ring containing at least one hydrocarbon or heteroatom, each X is independently selected from B, N, $CR_1$, $SiR_2$, P, P═O, and P═S, $Y_1$ to $Y_3$ are identical to or different from each other and are each independently a divalent group selected from the following structures Y-1 to Y-11:

(Y-1)

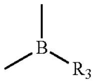

(Y-2)

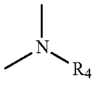

(Y-3)

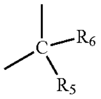

(Y-4)

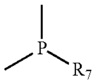

(Y-5)

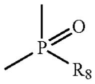

(Y-6)

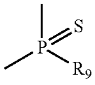

(Y-7)

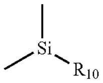

(Y-8)

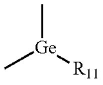

-continued (Y-9)

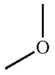

(Y-10)

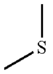

(Y-11)

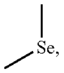

and $R_1$ to $R_{11}$ are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, substituted or unsubstituted $C_1$-$C_{30}$ non-aromatic rings, and a structure represented by Formula W:

[Formula W]

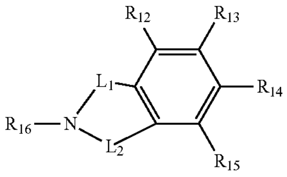

wherein $L_1$ and $L_2$ are identical to or different from each other and are each independently a substituted or unsubstituted aliphatic linker containing at least one hydrocarbon or heteroatom or a single bond, and $R_{12}$ to $R_{16}$ are as defined for $R_1$ to $R_{11}$.

The polycyclic compounds of the present invention can be used to fabricate organic electroluminescent devices with high performance.

Each of the compounds represented by Formulae A, B, and C contains at least one structure represented by Formula W and having the following structural features:

(1) two adjacent ones of $R_{12}$ to $R_{15}$ are optionally combined with the ring e or g to form $Q_1$ to $Q_3$ in Formula A, are optionally combined with the ring j, g or e to form $Q_1$ to $Q_3$ in Formula B or are optionally combined with the ring k, g or e to form $Q_1$ to $Q_3$ in Formula C; and (2) $L_1$ and $L_2$ or one of $R_{12}$ to $R_{16}$ are optionally bonded to $Q_1$ to $Q_3$ or $R_1$ to $R_{11}$.

The structures of the compounds represented by Formulae A, B, and C can be specifically found in the compounds 1 to 108 that are exemplified below.

According to one embodiment of the present invention, the structure represented by Formula W and having the feature (2) may be represented by Formula W1:

[Formula W1]

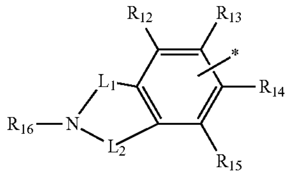

wherein * indicates that $L_1$ and $L_2$ or one of $R_{12}$ to $R_{16}$ are bonded to $Q_1$ to $Q_3$ or $R_1$ to $R_{11}$ (that is, $Y_1$ to $Y_3$ or one or more of $Q_1$ to $Q_3$ in each of Formulae A, B, and C are connected to the structure represented by Formula W to form a substituted structure) and $L_1$, $L_2$, and $R_{12}$ to $R_{16}$ are as defined in Formula W.

The structure represented by Formula W1 can be specifically found in the compounds 62 to 68 that are exemplified below.

According to one embodiment of the present invention, the structure represented by Formula W and having the feature (1) may be selected from structures represented by Formulae W2, W3, and W4:

[Formula W2]

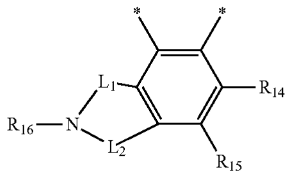

[Formula W3]

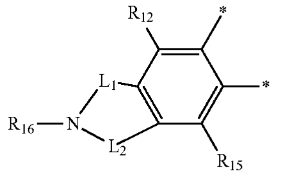

[Formula W4]

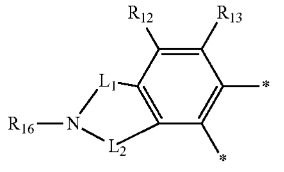

wherein each of the two adjacent asterisks (*) is optionally combined with the ring e or g to form $Q_1$ to $Q_3$ in Formula A, is optionally combined with the ring j, g or e to form $Q_1$ to $Q_3$ in Formula B or is optionally combined with the ring k, g or e to form $Q_1$ to $Q_3$ in Formula C (that is, at least one of $Q_1$ to $Q_3$ in each of Formulae A, B, and C contains the structure represented by Formula W) and $L_1$, $L_2$, and $R_{12}$ to $R_{16}$ are as defined in Formula W.

The structures represented by Formulae W2, W3, and W4 can be found specifically in the compounds 1 to 61 that are exemplified below.

$L_1$ and $L_2$ are identical to or different from each other and are each independently an aliphatic linker containing at least one hydrocarbon or heteroatom or a single bond. $L_1$ and $L_2$ may be optionally further substituted with one or more substituents. The aliphatic linkers refer to saturated or unsaturated linking groups selected from alkylene, alkenylene, alkynylene, and combinations thereof. When the aliphatic linkers contain alkenylene groups or are bonded to $R_{16}$, $R_{16}$ in N—$R_{16}$ may be undefined, that is, $R_{16}$ may be excluded from Formulae A, B, and C, considering the chemical bond of N in N—$R_{16}$.

According to one embodiment of the present invention, each of $R_1$ to $R_{16}$, $Q_1$ to $Q_3$, $L_1$, $L_2$, and their substituents may optionally form a substituted or unsubstituted ring with an adjacent substituent.

$R_1$ to $R_{11}$ may be each independently selected from substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, and substituted or unsubstituted $C_1$-$C_{50}$ heteroaryl.

According to one embodiment of the present invention, $Q_1$ and $Q_2$ in Formula A may be bonded together to form a substituted or unsubstituted aliphatic, aromatic or non-aromatic ring containing at least one hydrocarbon or heteroatom.

According to one embodiment of the present invention, the compounds represented by Formulae A, B, and C may have various polycyclic aromatic backbone structures, including those represented by Formulae A-1, B-1, B-2, B-3, C-1, and C-2:

[Formula A-1]

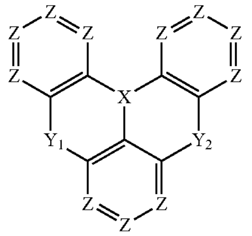

[Formula B-1]

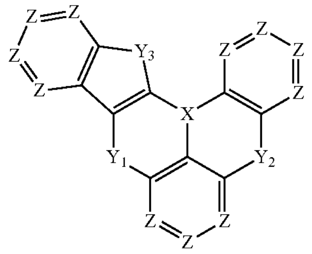

[Formula B-2]

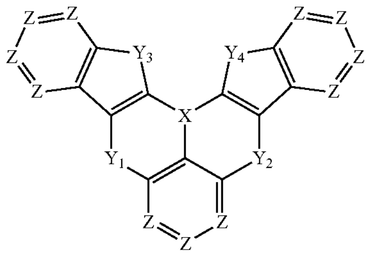

[Formula B-3]

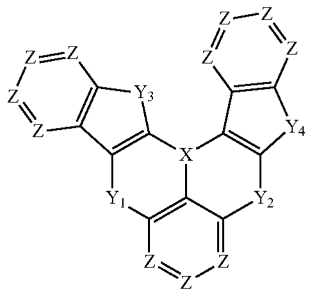

-continued

[Formula C-1]

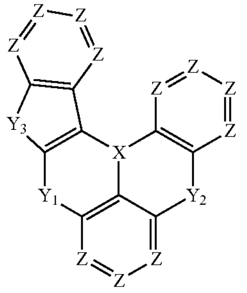

[Formula C-2]

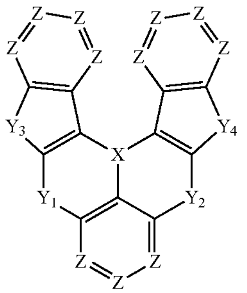

wherein the moieties Z are identical to or different from each other and are each independently CR or N, the groups R are identical to or different from each other and are each independently selected from hydrogen, deuterium, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, substituted or unsubstituted $C_1$-$C_{30}$ non-aromatic rings, the structure represented by Formula W, and halogen.

The groups R may be bonded to each other or may be connected to an adjacent substituent to form an alicyclic or aromatic monocyclic or polycyclic ring optionally substituted with one or more heteroatoms selected from N, S, and O, and X and $Y_1$ to $Y_4$ are as defined in Formulae A, B, and C.

The use of the backbone structures meets the desired requirements of various organic layers of organic electroluminescent devices to achieve high performance of the devices.

As used herein, the term "substituted" and "further substituted with substituents" in Formula A to Formula C, Formula W, etc. indicates substitution with one or more substituents selected from deuterium, cyano, halogen, hydroxyl, nitro, $C_1$-$C_{24}$ alkyl, $C_3$-$C_{24}$ cycloalkyl, $C_1$-$C_{24}$ haloalkyl, $C_1$-$C_{24}$ alkenyl, $C_1$-$C_{24}$ alkynyl, $C_1$-$C_{24}$ heteroalkyl, $C_1$-$C_{24}$ heterocycloalkyl, $C_6$-$C_{24}$ aryl, $C_6$-$C_{24}$ arylalkyl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_1$-$C_{24}$ arylamino, $C_1$-$C_{24}$ heteroarylamino, $C_1$-$C_{24}$ alkylsilyl, $C_1$-$C_{24}$ arylsilyl, and $C_1$-$C_{24}$ aryloxy, or a combination thereof. As used herein, the term "unsubstituted" indicates having no substituent.

In the "substituted or unsubstituted $C_1$-$C_{30}$ alkyl", "substituted or unsubstituted $C_6$-$C_{50}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted aliphatic, aromatic or non-aromatic ring containing at least one hydrocarbon or heteroatom and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

The definitions of the terms "aliphatic ring", "aliphatic linker", "aromatic ring", and "non-aromatic ring" are as follows.

The aliphatic ring refers to a saturated or unsaturated ring consisting of alkylene, alkenylene, and/or alkynylene and optionally containing at least one hydrocarbon ring or heteroatom. The aliphatic linker also refers to a saturated or unsaturated linking group selected from alkylene, alkenylene, alkynylene, and combinations thereof.

Specifically, the aromatic ring may be, for example, naphthalene, anthracene, benzanthracene, benzopyrene, acenaphthylene, 1,2-dihydroacenaphthylene, phenanthrene, chrysene, indenopyrene, fluorene, fluoranthene, benzacephenanthrylene, benzoperylene, pyrene, benzofluoranthene, dibenzanthracene, benzofuran, dibenzofuran, benzothiophene, dibenzothiophene, indole or carbazole.

The non-aromatic ring refers to a fused ring of the aromatic ring and the aliphatic ring and specific examples thereof include, but are not limited to, the following structures:

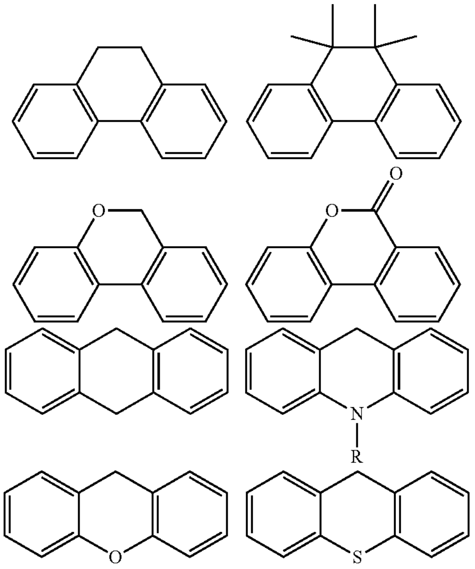

-continued

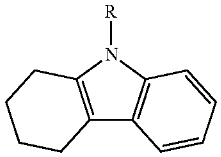
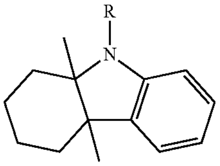
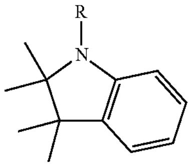
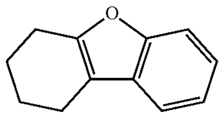
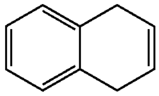
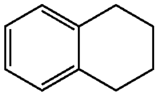
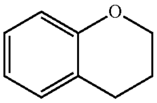
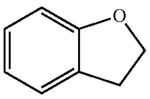
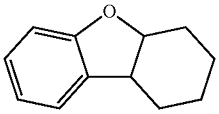
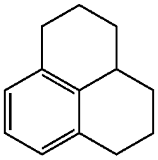

The other substituents are known to those skilled in the art to which the present invention pertains. The alkyl groups may be straight or branched, and the numbers of carbon atoms therein are not particularly limited but are preferably 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The alkoxy group may be specifically a methoxy, ethoxy, propoxy, isobutyloxy, sec-butyloxy, pentyloxy, iso-amyloxy or hexyloxy group but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, —$NH_2$, alkylamine groups, and heteroarylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups. The aryl moieties in the arylamine groups may be monocyclic or polycyclic ones. The arylamine groups may include two or more aryl moieties. In this case, the aryl moieties may be monocyclic aryl moieties or monocyclic heteroaryl moieties. Alternatively, the aryl moieties may consist of a monocyclic aryl moiety and a polycyclic aryl moiety. The aryl moieties in the arylamine groups may be selected from those exemplified above.

The aryl moieties in the aryloxy group and the arylthioxy group are the same as those described above for the aryl groups. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the polycyclic compounds represented by Formulae A, B, and C according to the present invention may be selected from, but not limited to, the following compounds 1 to 108:
1
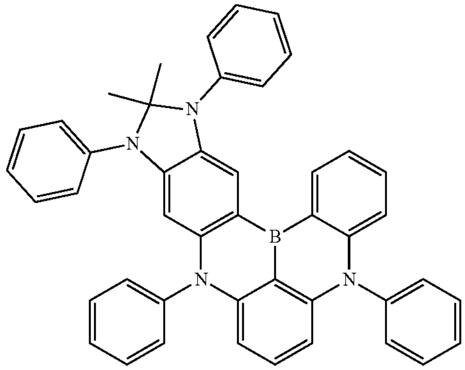
2
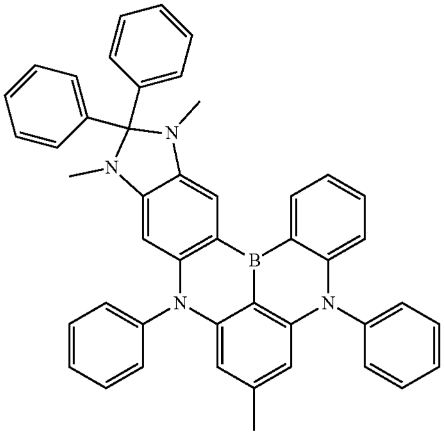
3
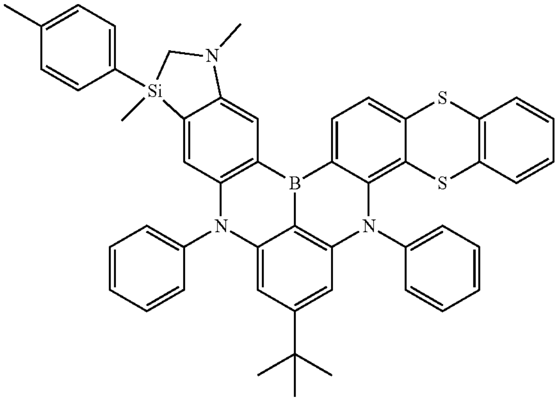
-continued
4
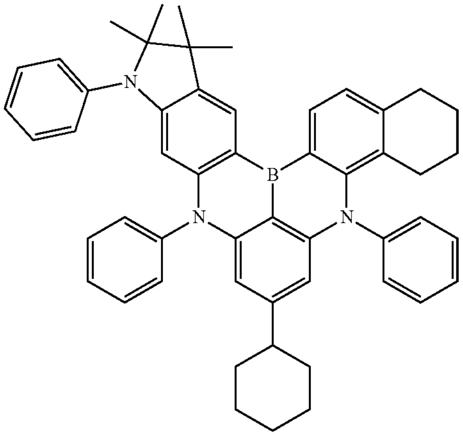
5
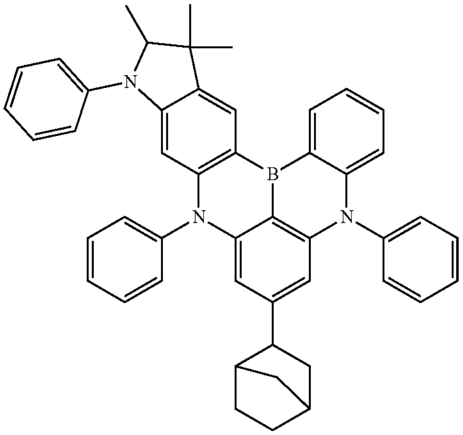
6
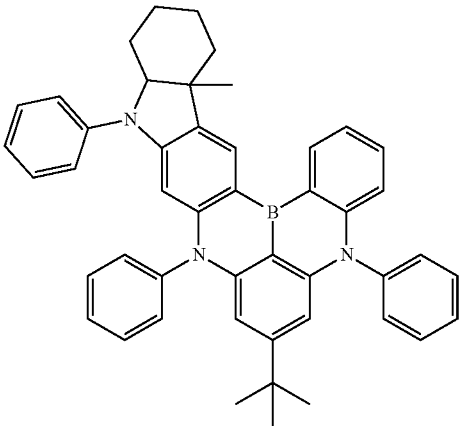

-continued
7
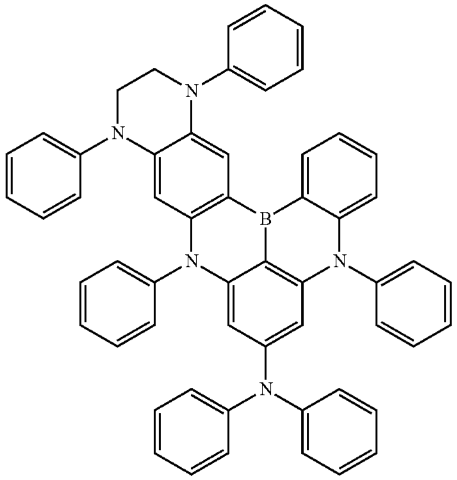
8
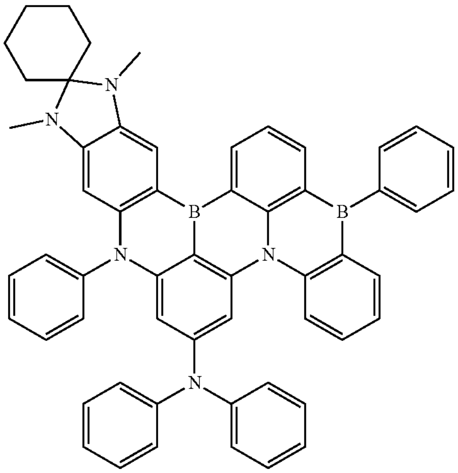
9
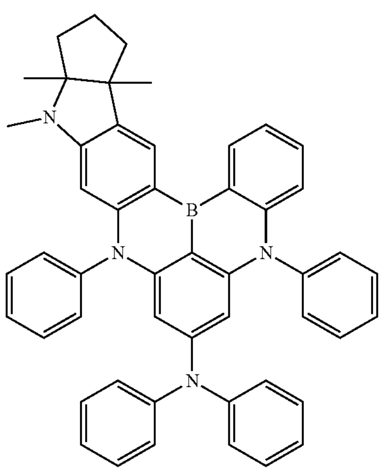
-continued
10
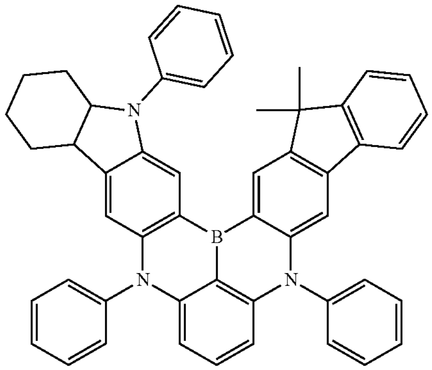
11
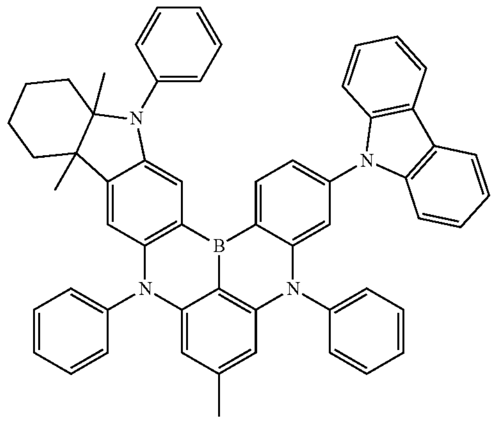
12
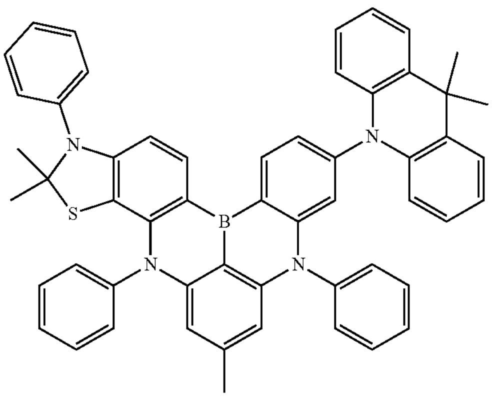
13
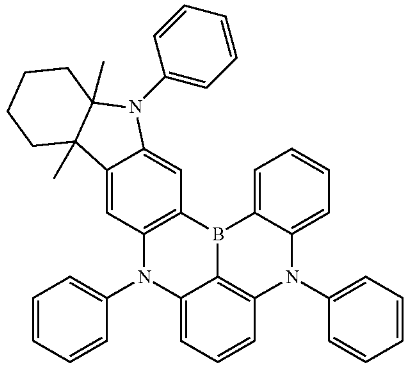

-continued
14
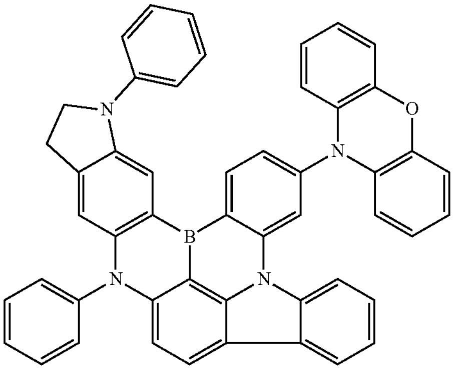
15
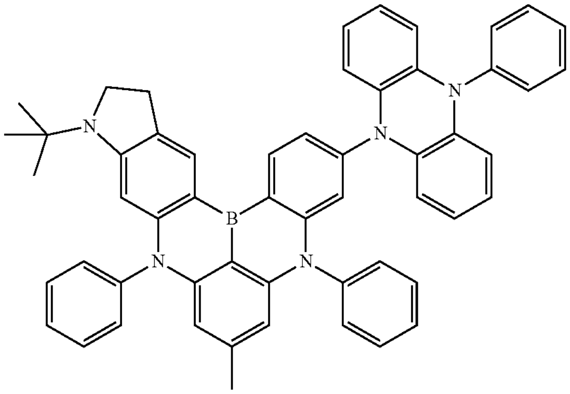
16
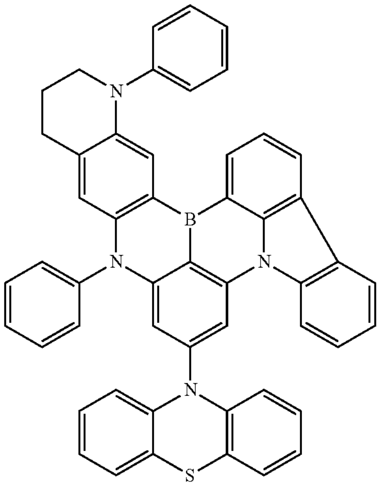
-continued
17
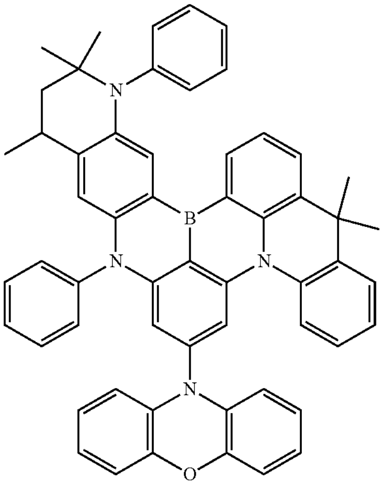
18
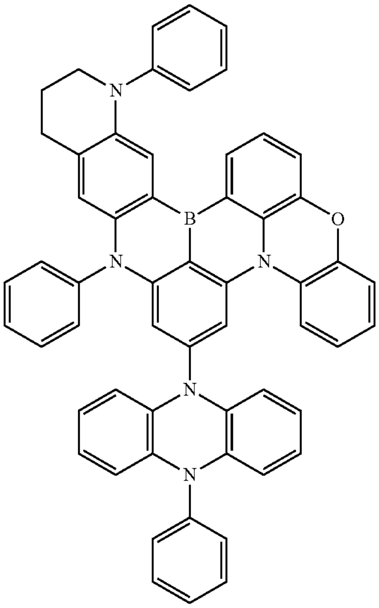
19
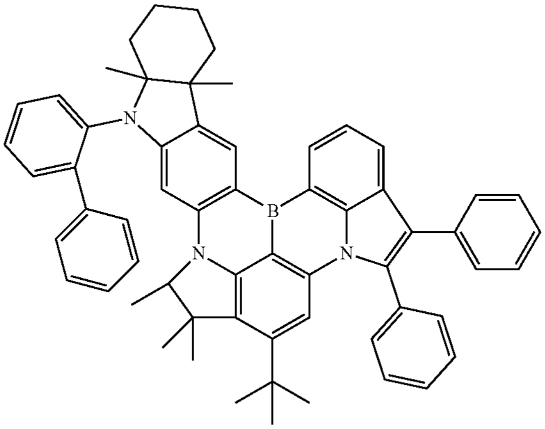

-continued
20
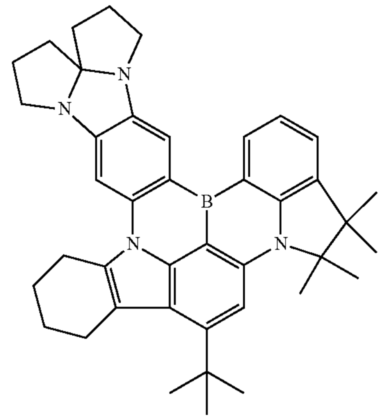
21
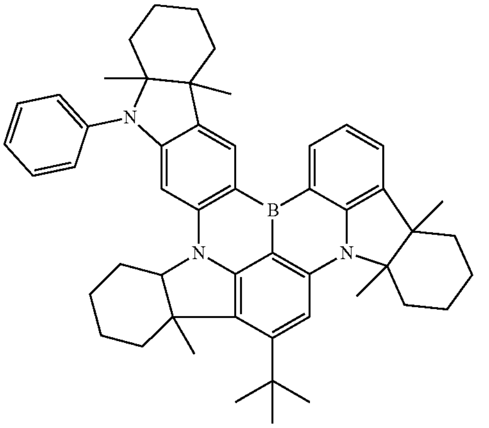
22
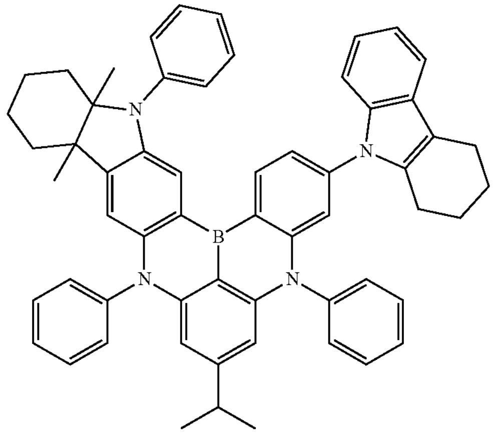
-continued
23
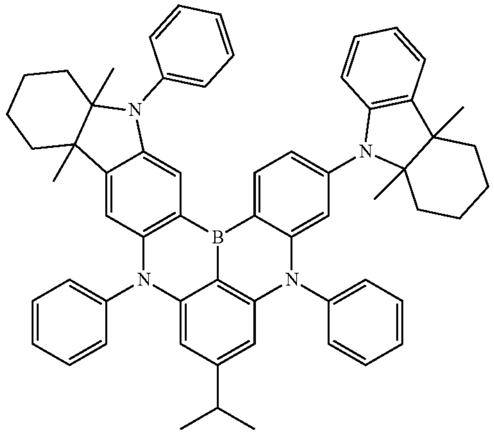
24
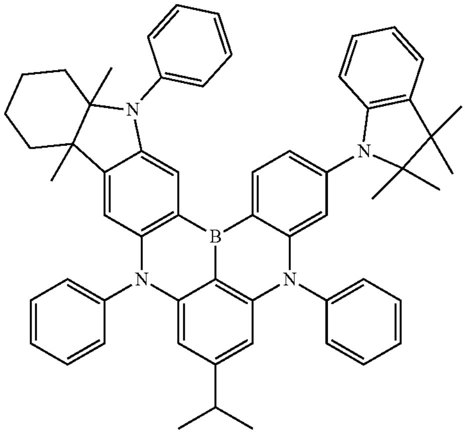
25
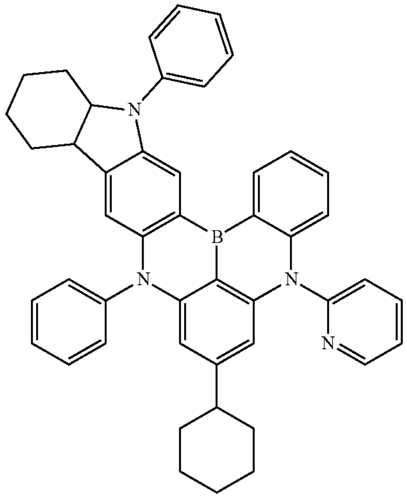

-continued
26
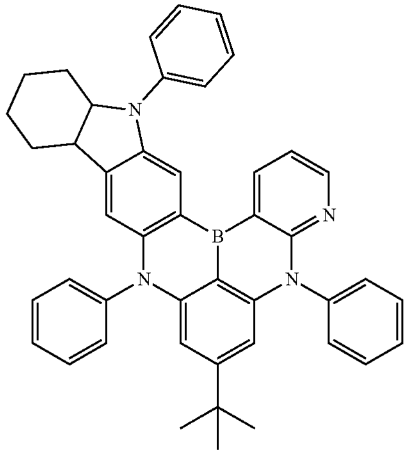
27
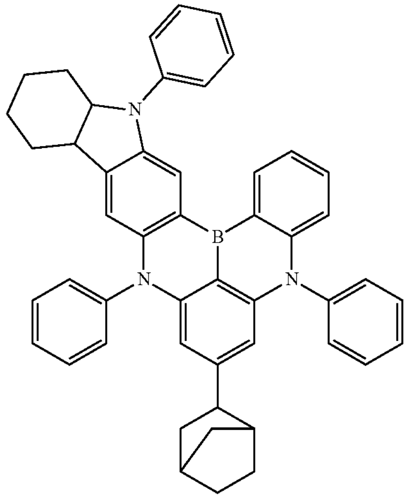
28
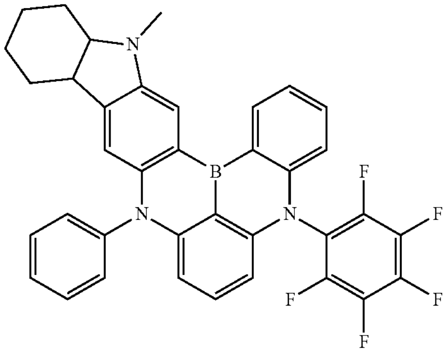
-continued
29
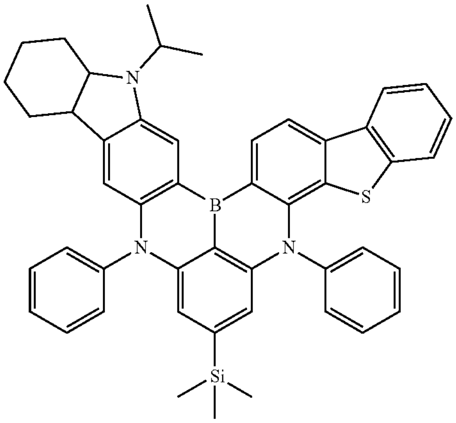
30
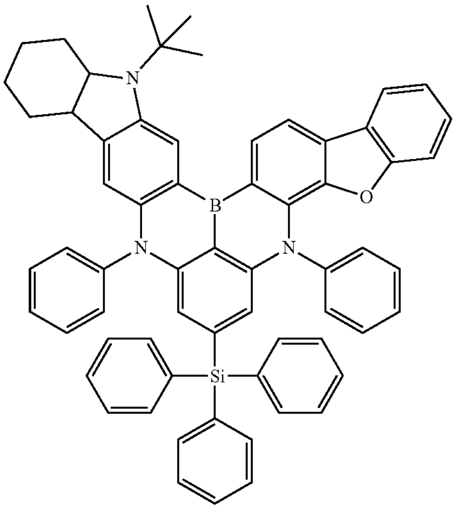
31
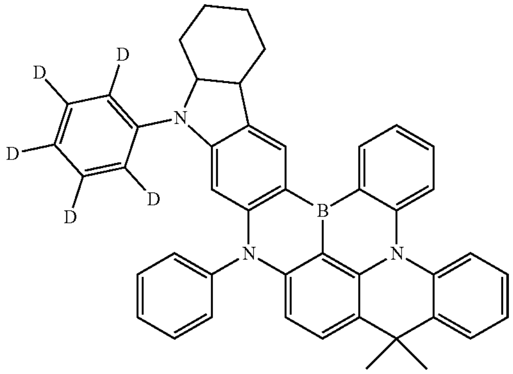

-continued
32
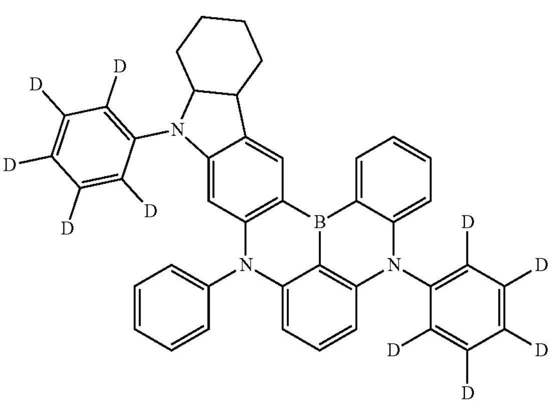
33
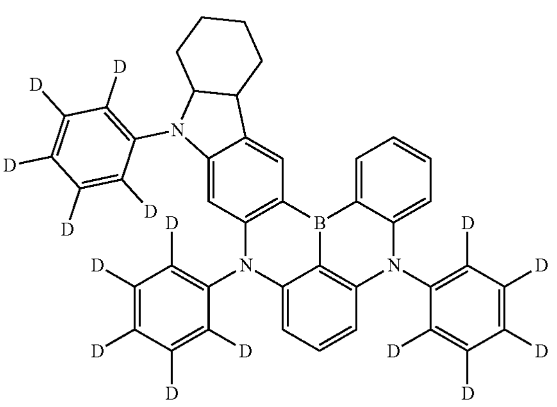
34
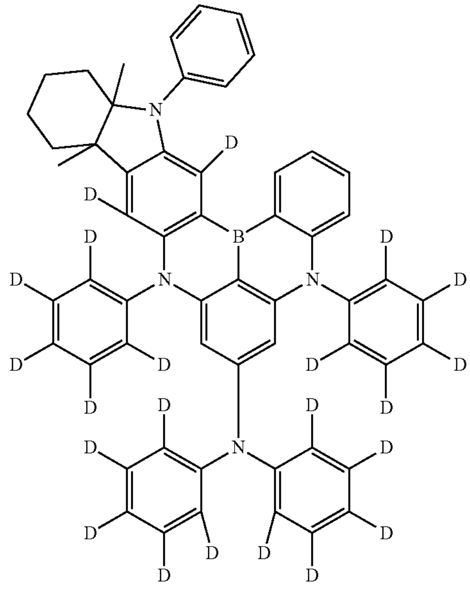
-continued
35
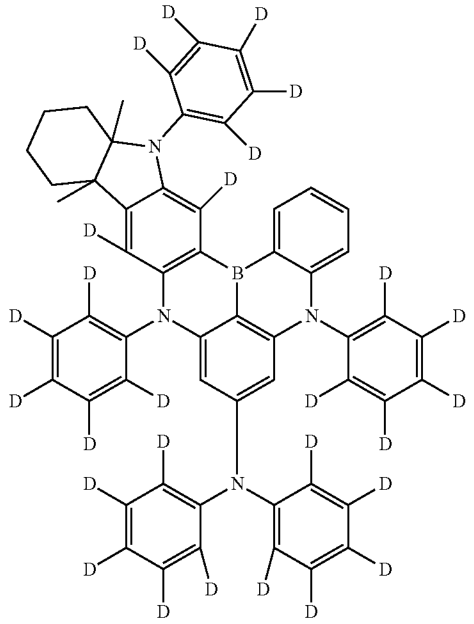
36
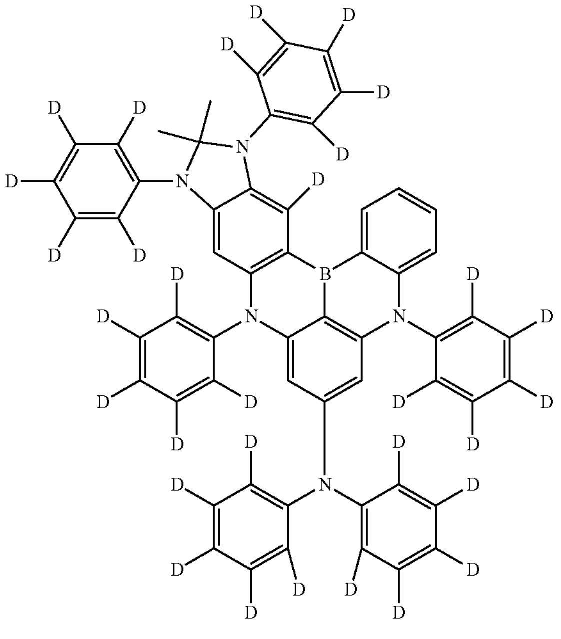

-continued
37
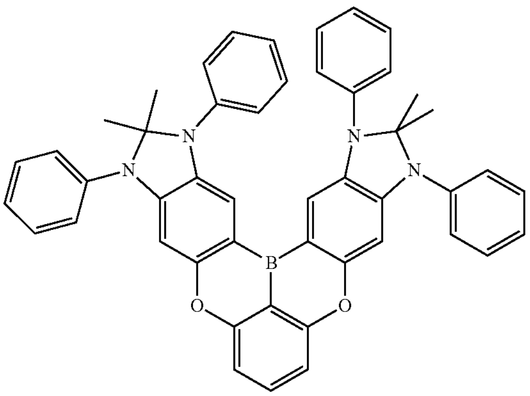
38
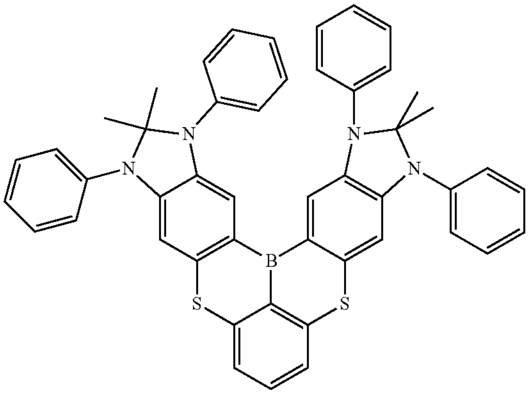
39
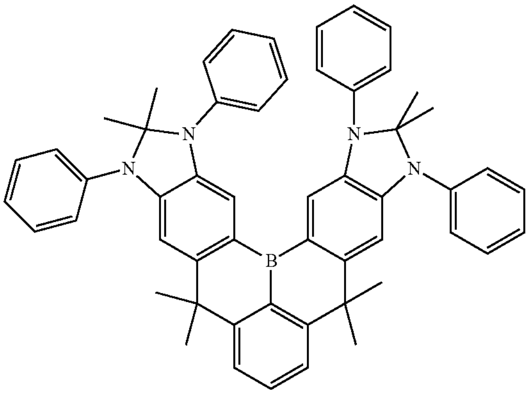
40
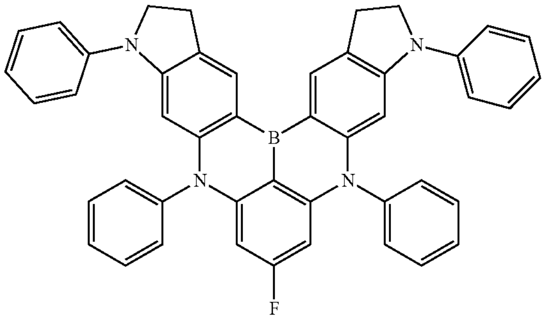
-continued
41
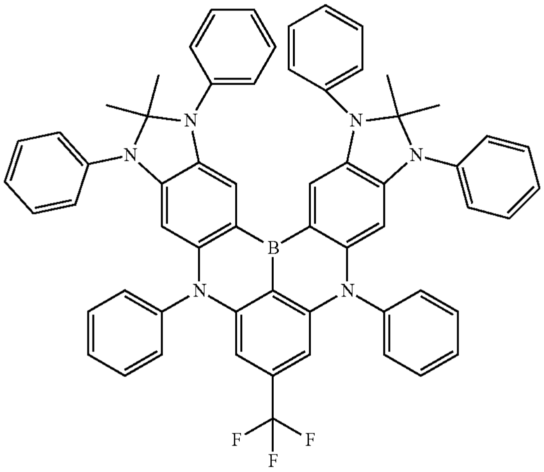
42
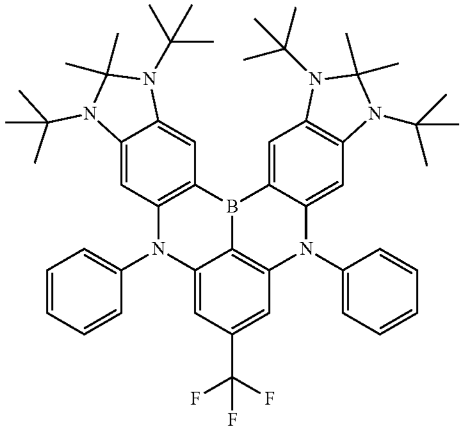
43
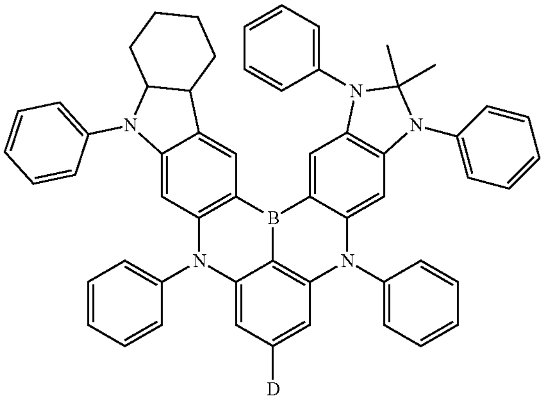

-continued
44
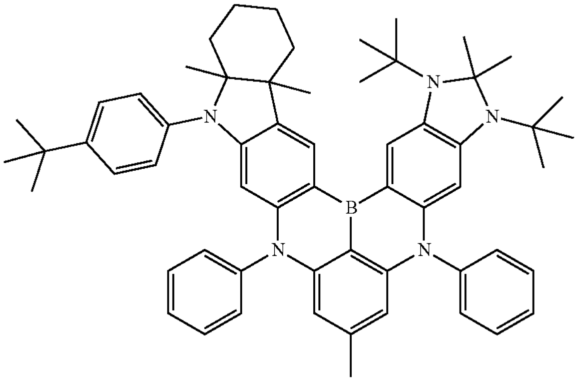
45
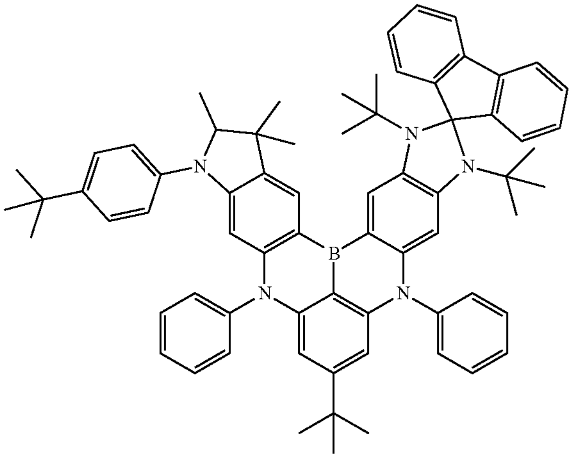
46
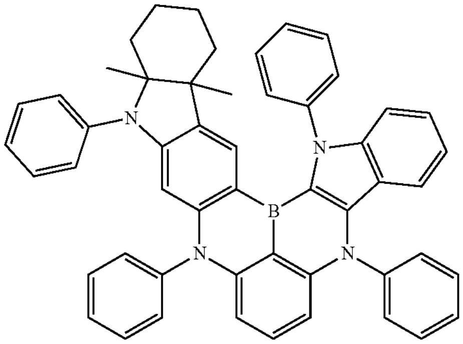
47
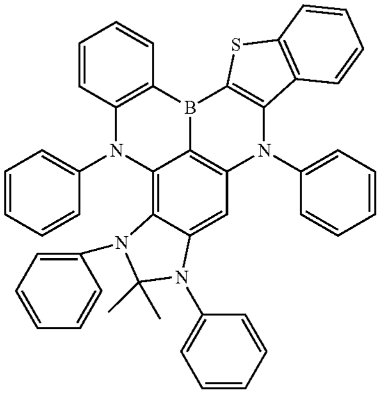
-continued
48
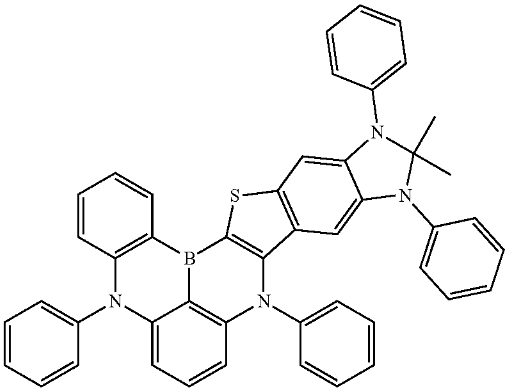
49
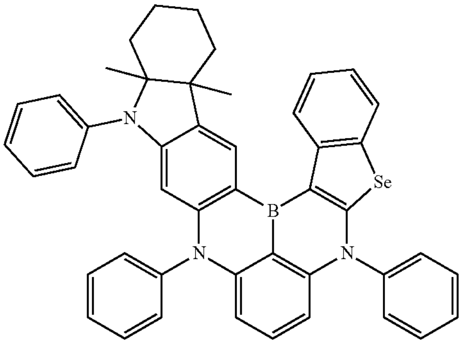
50
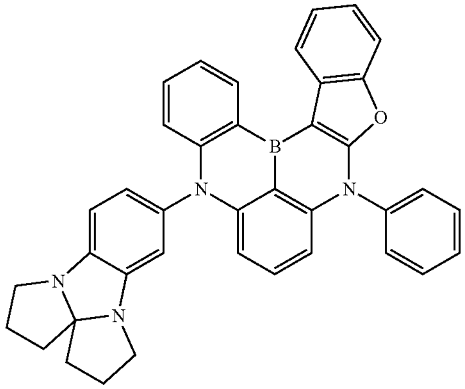
51
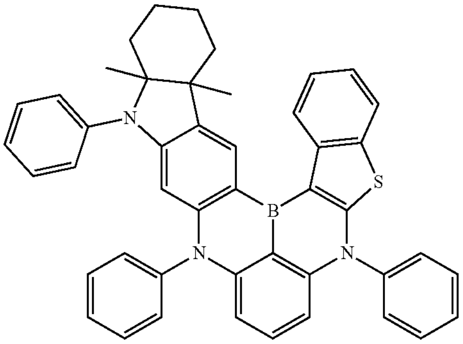

-continued
52
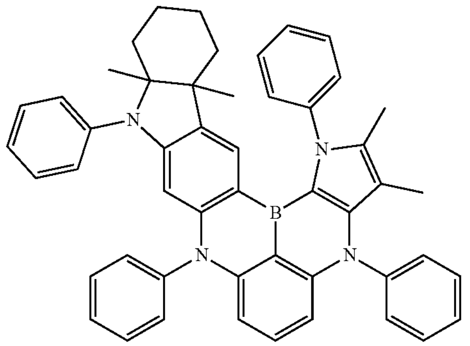
53
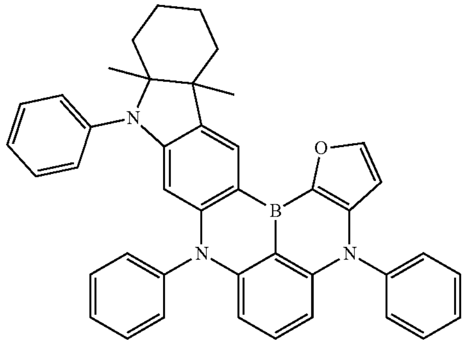
54
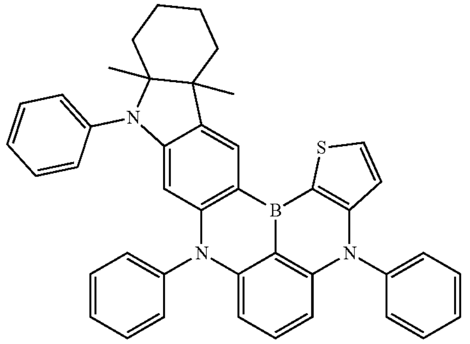
55
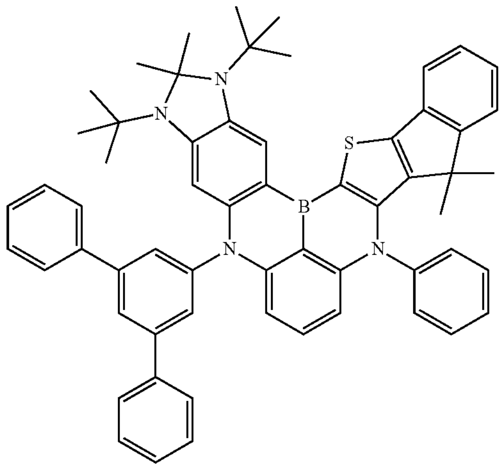
-continued
56
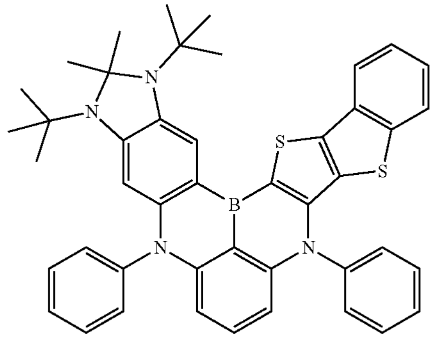
57
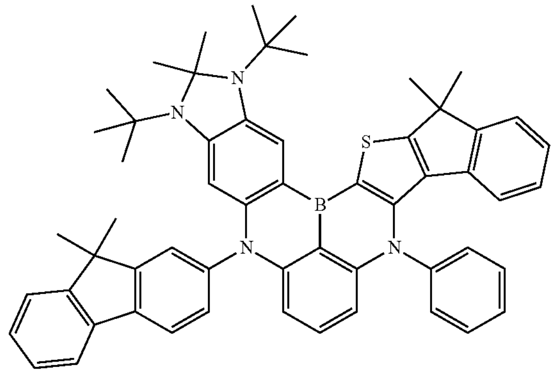
58
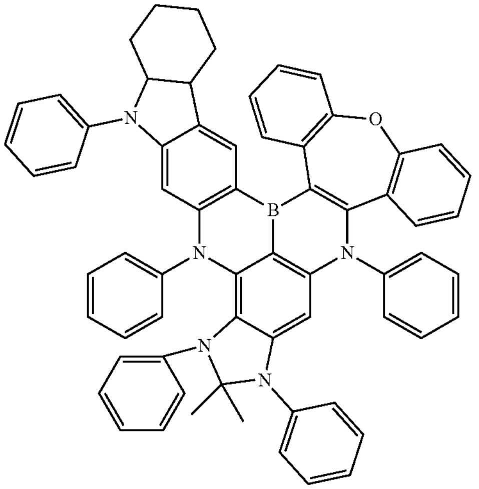
59
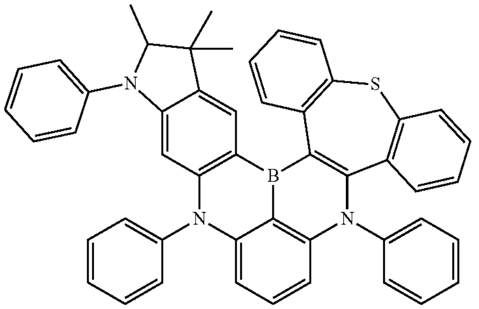

-continued
60
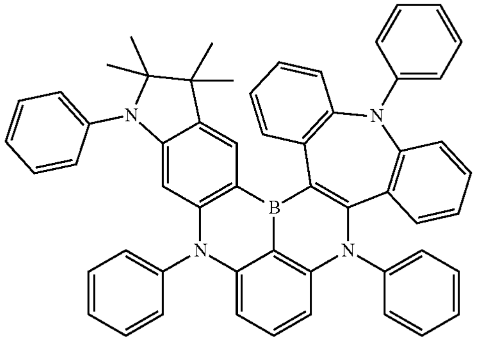
61
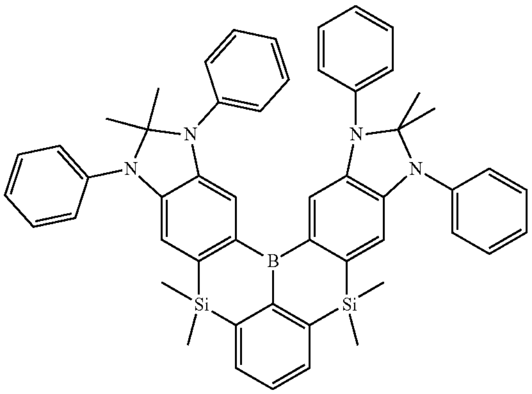
62
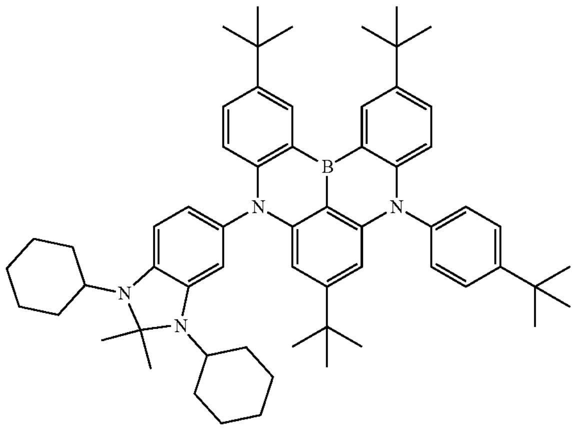
63
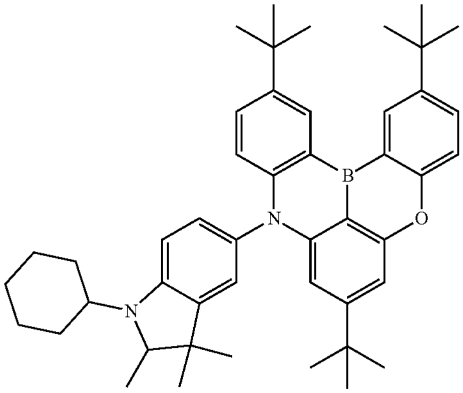
-continued
64
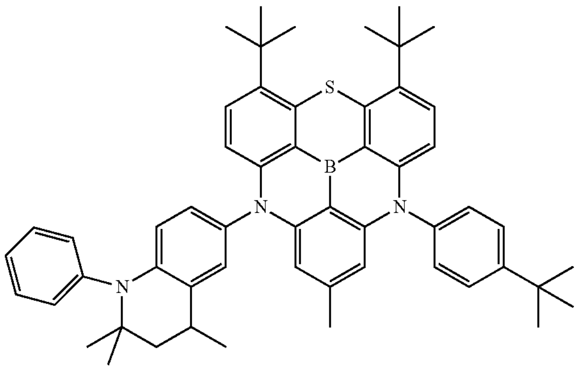
65
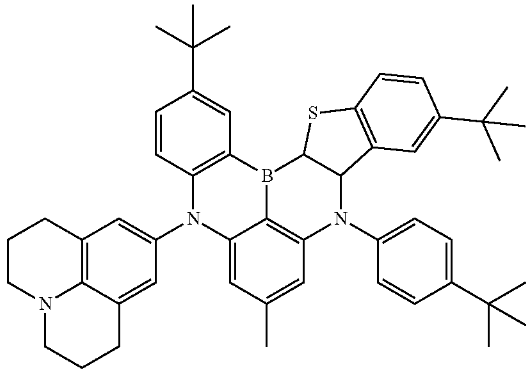
66
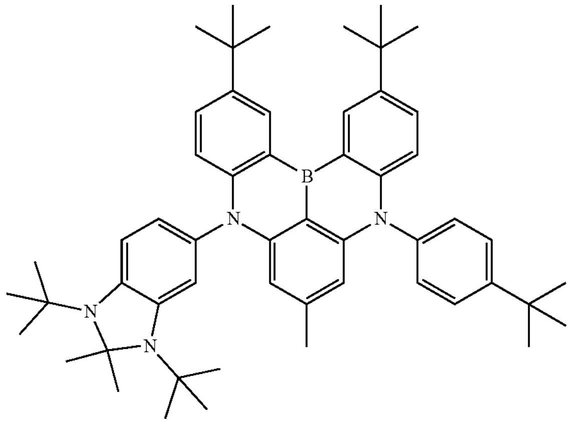

-continued
67
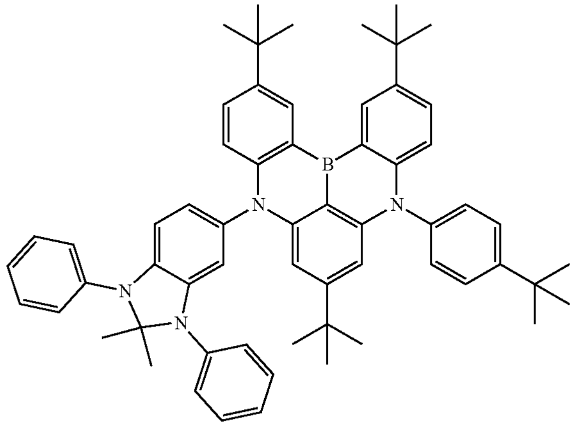
68
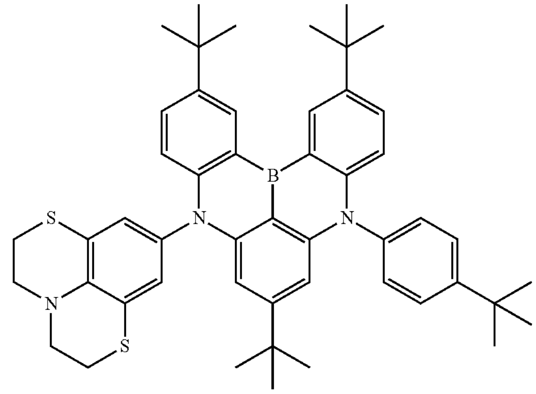
69
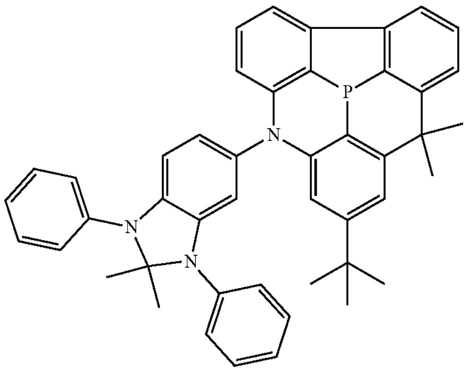
70
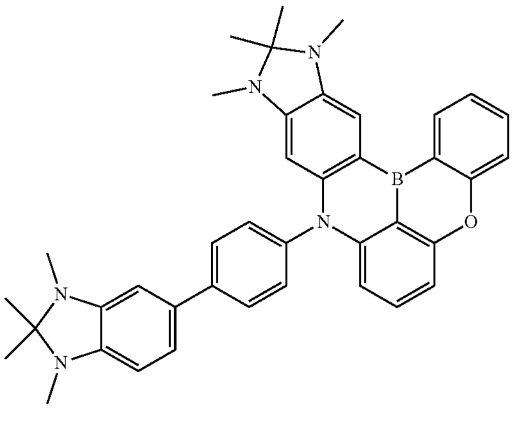
-continued
71
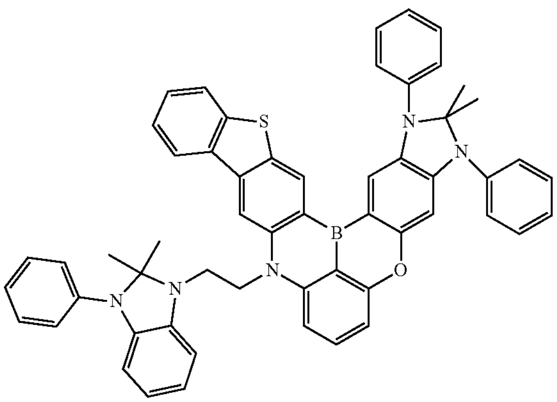
72
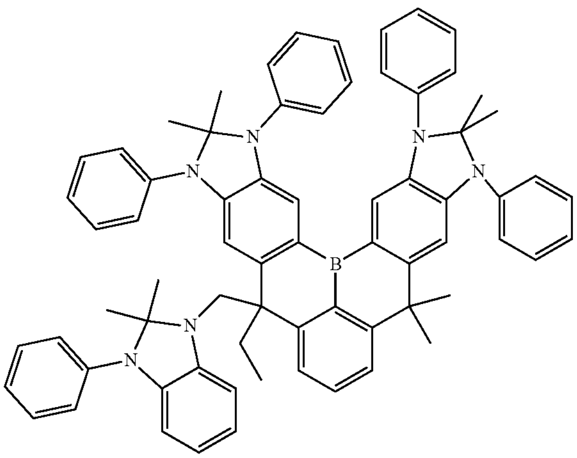
73
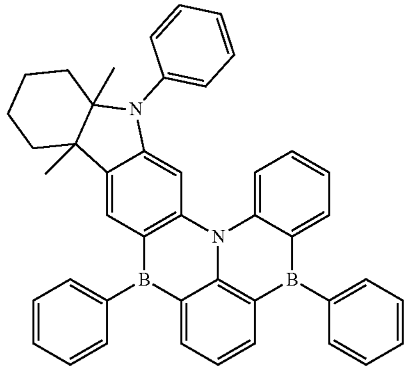
74
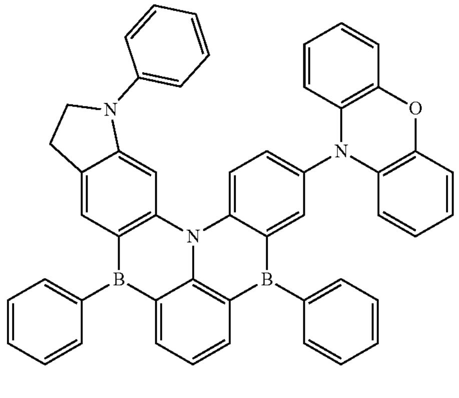

-continued
75
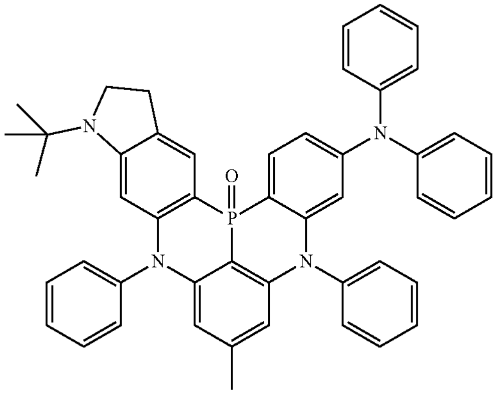
76
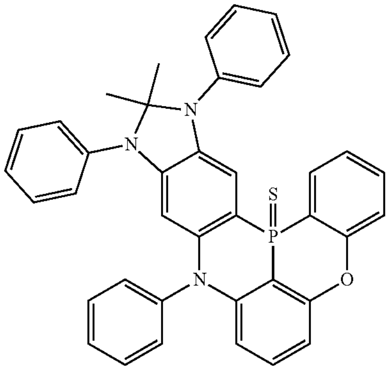
77
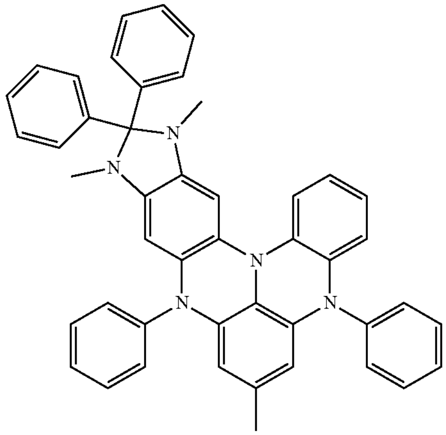
78
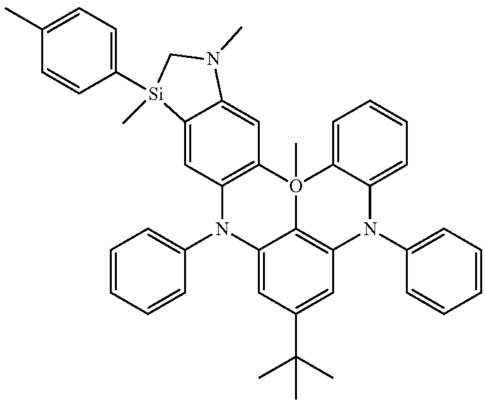
-continued
79
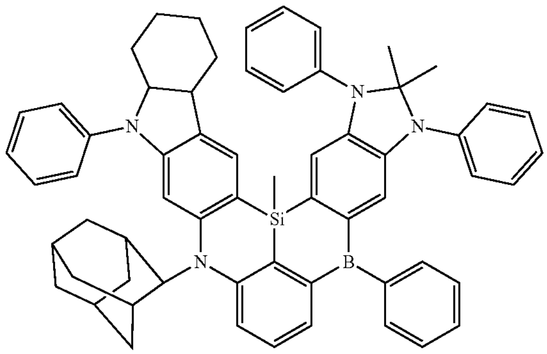
80
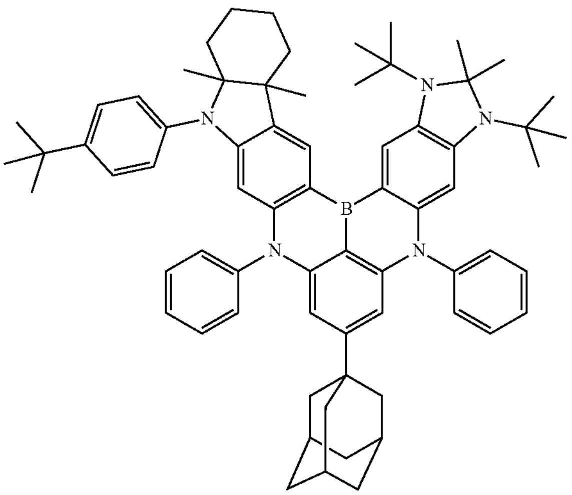
81
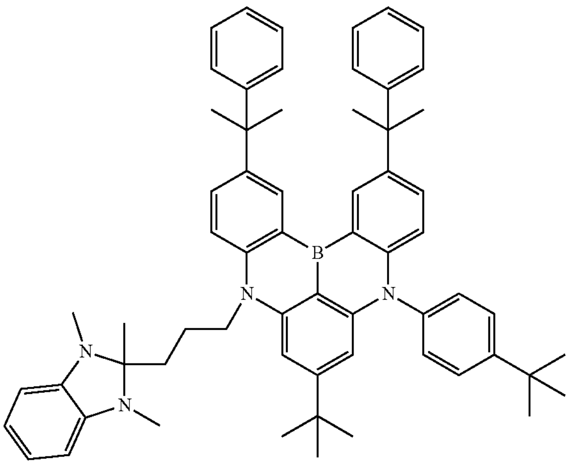

-continued
82
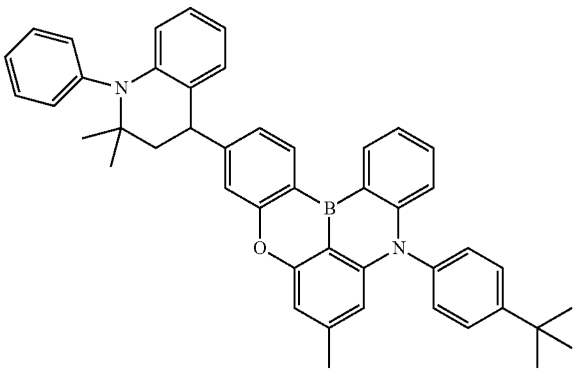
83
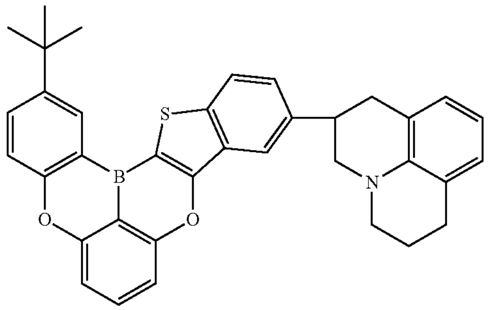
84
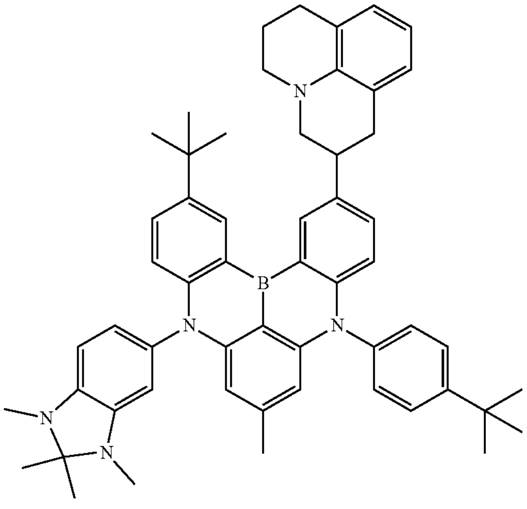
85
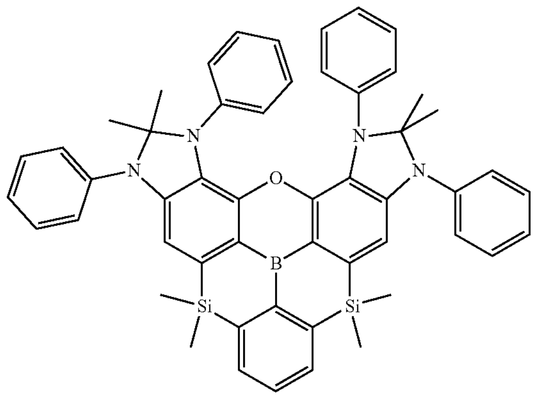
-continued
86
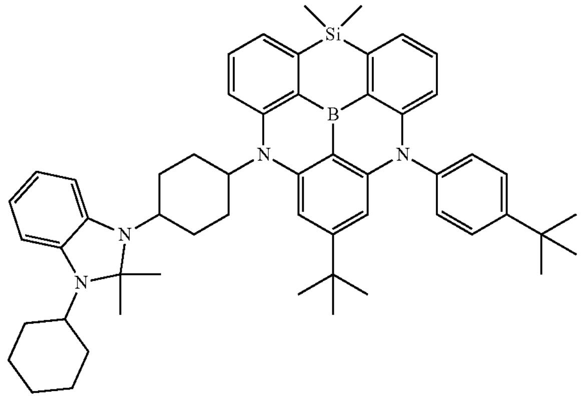
87
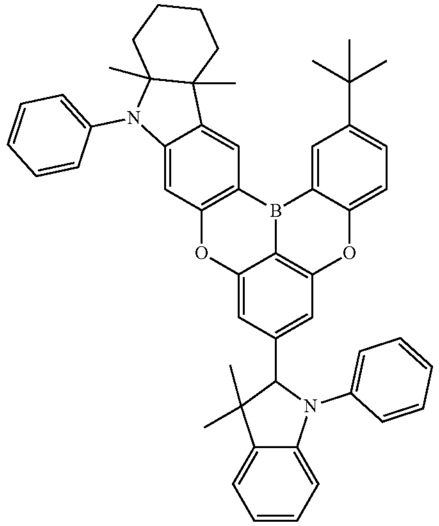
88
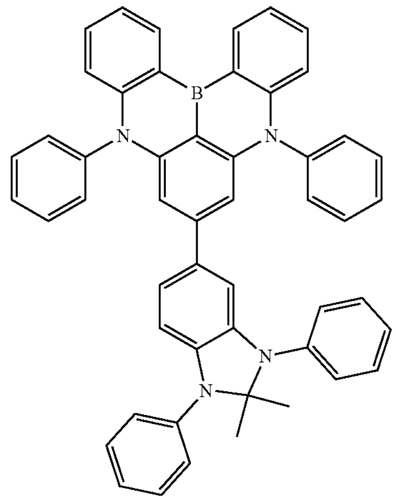

-continued
89
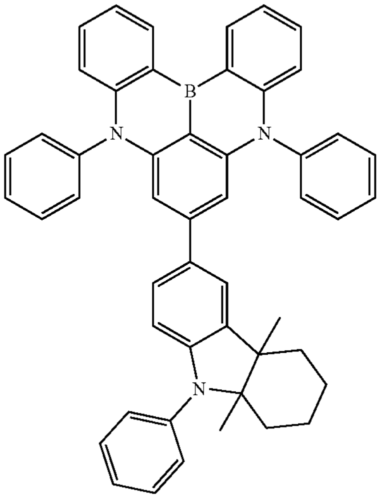
90
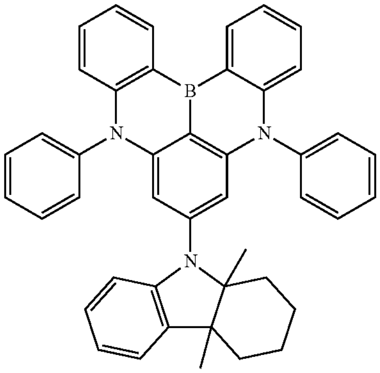
91
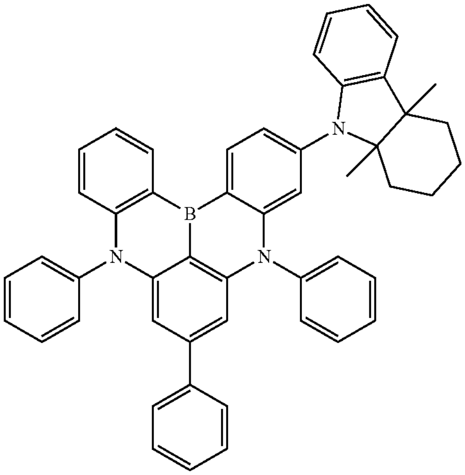
-continued
92
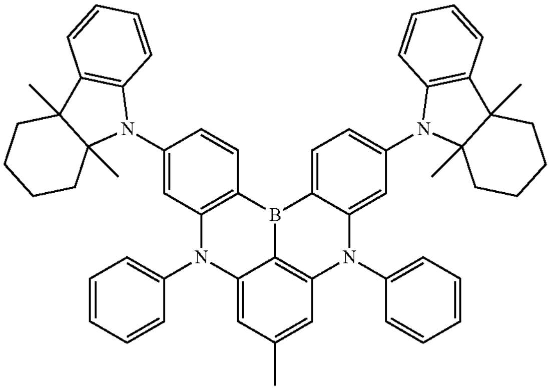
93
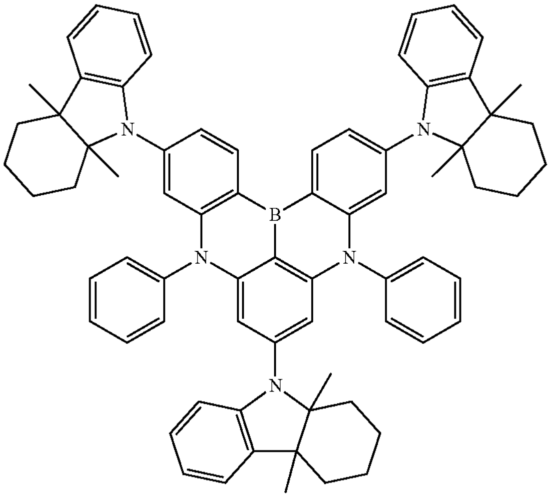
94
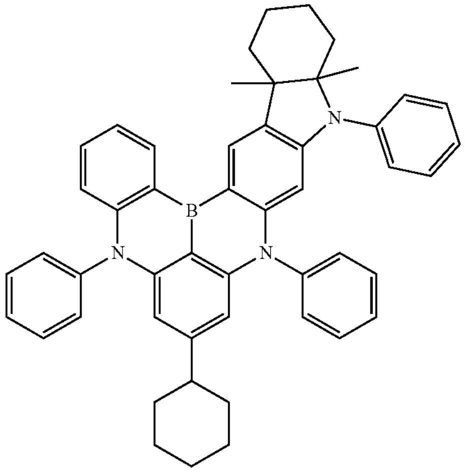

-continued
95
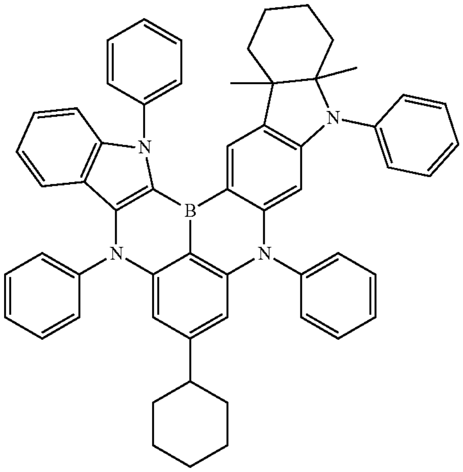
96
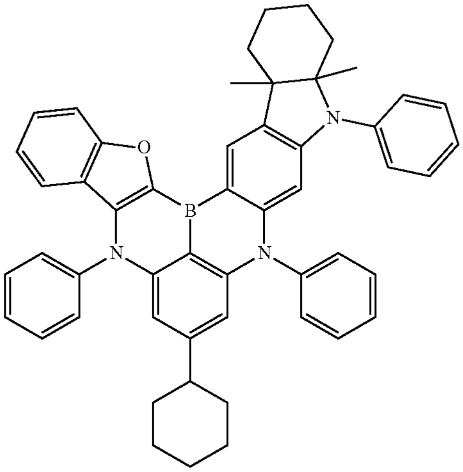
97
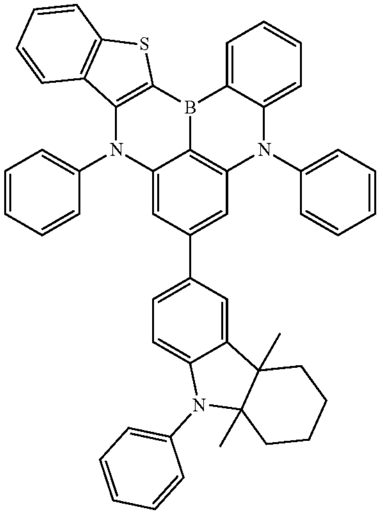
-continued
98
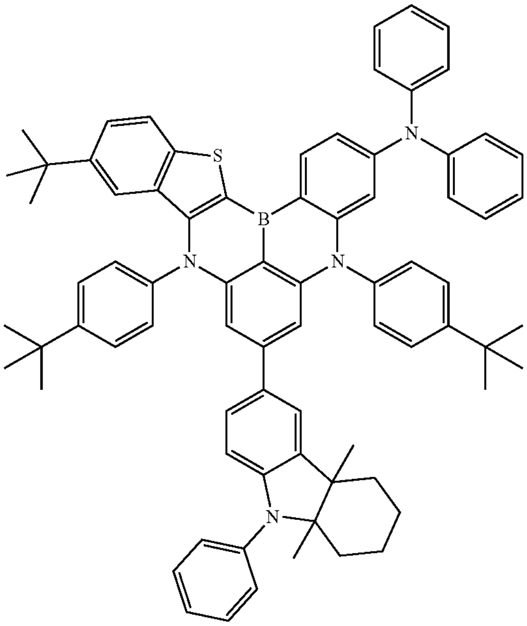
99
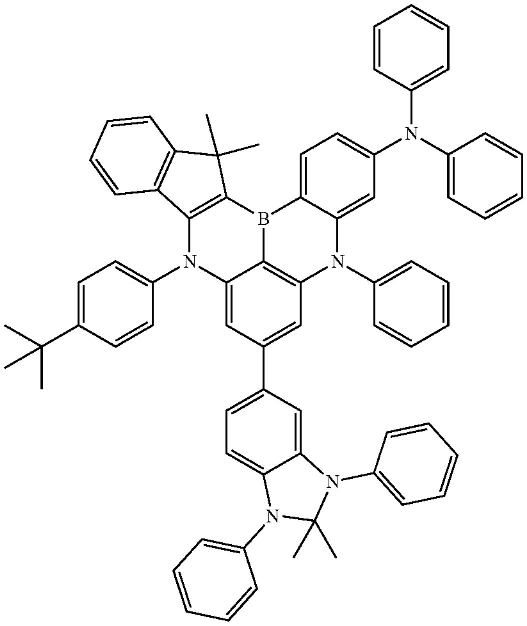

-continued
100
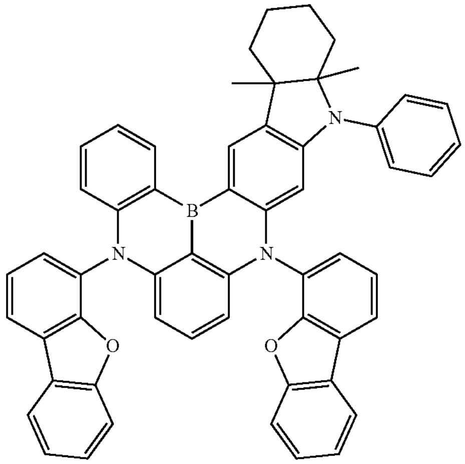
101
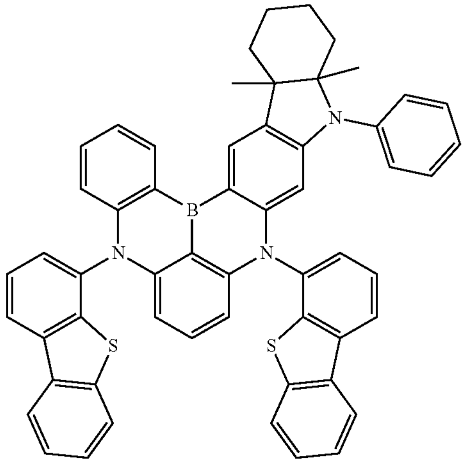
102
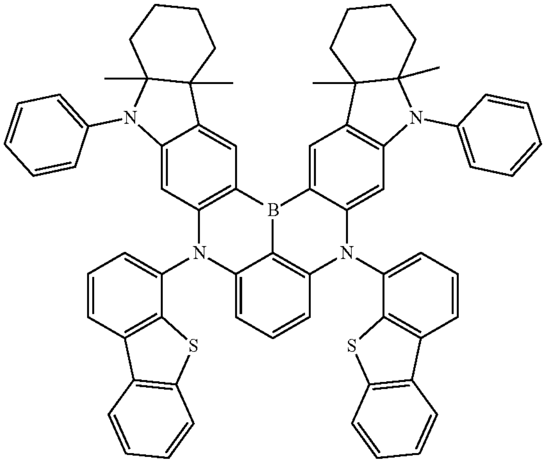
-continued
103
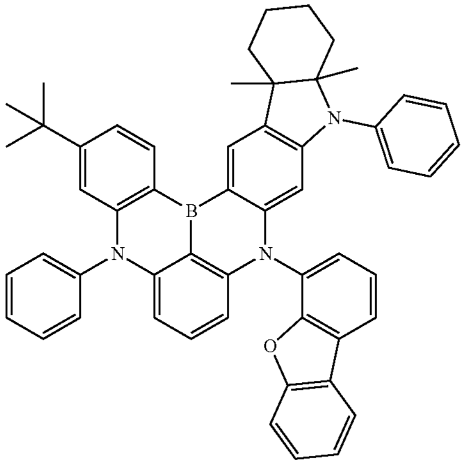
104
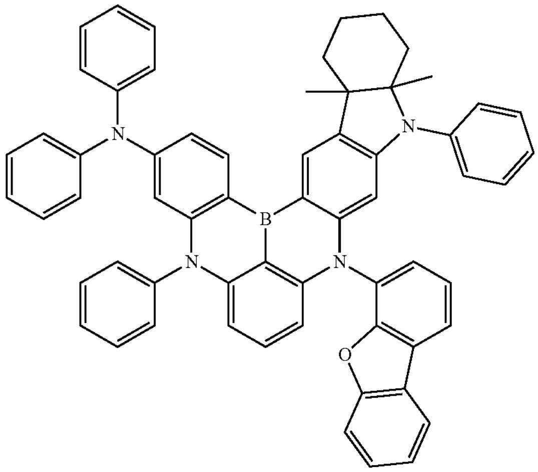
105
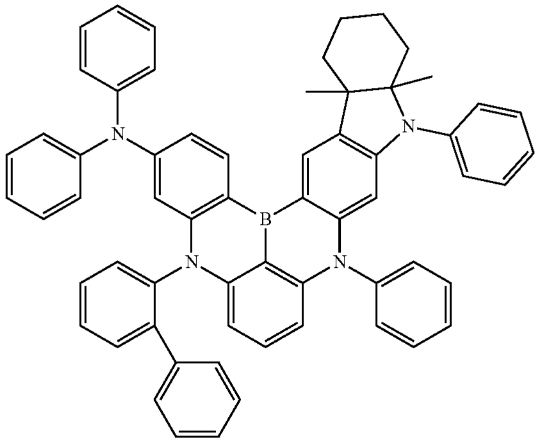

-continued

106

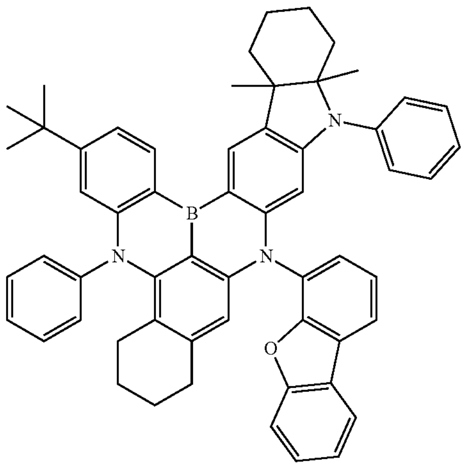

107

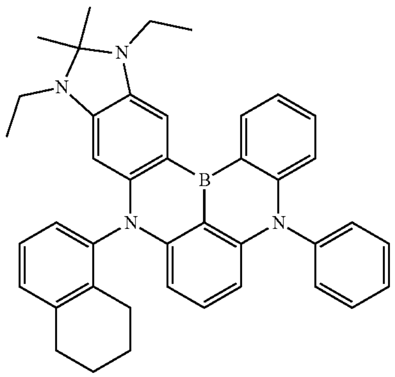

108

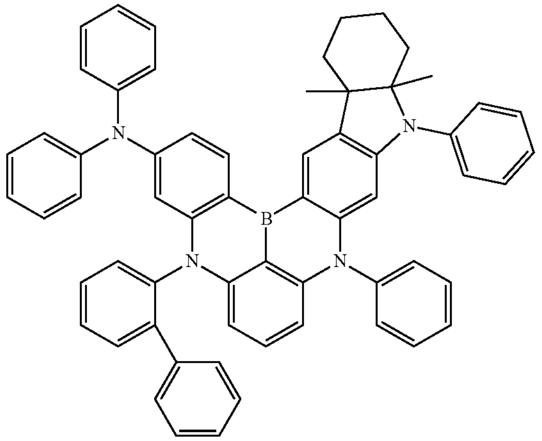

The specific substituents in Formulae A, B, and C can be clearly seen from the structures of the compounds 1 to 108 but are not intended to limit the scope of the compounds represented by Formulae A, B, and C.

As can be seen from the above specific compounds, the polycyclic compounds of the present invention contain B, N, CR, SiR, P, P═O, and P═S and have polycyclic ring structures. The introduction of substituents into the polycyclic ring structures enables the synthesis of materials for organic electroluminescent devices with inherent characteristics of the backbone structures and the substituents. For example, the backbone structures and the substituents are designed for use in hole injecting layers, hole transport layers, light emitting layers, electron transport layers, electron injecting layers, electron blocking layers, and hole blocking layers of organic electroluminescent devices. This introduction meets the requirements of the organic layers and enables the fabrication of organic electroluminescent devices with high performance. The compounds of the present invention may be used alone or in combination with other compounds to form various organic layers.

A further aspect of the present invention is directed to an organic electroluminescent device including a first electrode, a second electrode, and one or more organic layers interposed between the first and second electrodes wherein one of the organic layers includes at least one of the polycyclic compounds represented by Formulae A, B, and C.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that at least one of the compounds of Formulae A, B, and C is used to form the corresponding organic layer.

The organic layers of the organic electroluminescent device according to the present invention may form a monolayer structure. Alternatively, the organic layers may have a multilayer stack structure. For example, the organic layers may have a structure including a hole injecting layer, a hole transport layer, a hole blocking layer, a light emitting layer, an electron blocking layer, an electron transport layer, and an electron injecting layer but is not limited to this structure. The number of the organic layers is not limited and may be increased or decreased. Preferred structures of the organic layers of the organic electroluminescent device according to the present invention will be explained in more detail in the Examples section that follows.

The organic electroluminescent device of the present invention will be described in more detail with reference to exemplary embodiments.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers such as a capping layer that have various functions depending on the desired characteristics of the device.

The light emitting layer of the organic electroluminescent device according to the present invention includes, as a host compound, an anthracene derivative represented by Formula D:

[Formula D]

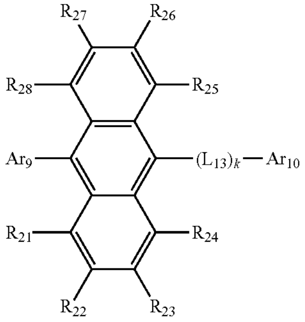

wherein $R_{21}$ to $R_{28}$ are identical to or different from each other and are as defined for $R_1$ to $R_{11}$ in Formulae A, B, and C, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

$Ar_9$ in Formula D is represented by Formula D-1:

[Formula D-1]

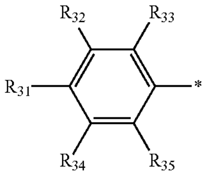

wherein $R_{31}$ to $R_{35}$ are identical to or different from each other and are as defined for $R_1$ to $R_{11}$ in Formulae A, B, and C and each of $R_{31}$ to $R_{35}$ is optionally bonded to an adjacent substituent to form a saturated or unsaturated ring.

The compound of Formula D employed in the organic electroluminescent device of the present invention may be specifically selected from the compounds of Formulae D1 to D48:

D1

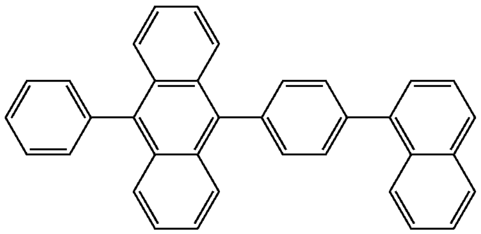

D2

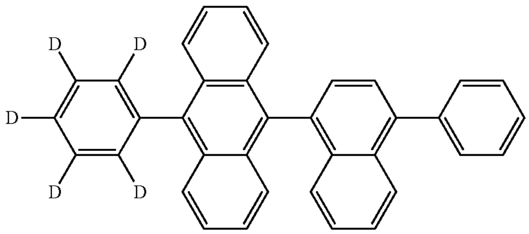

D3

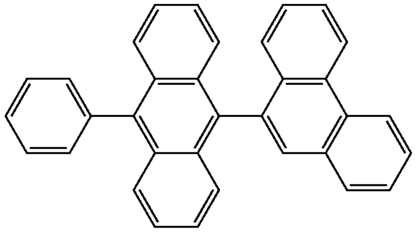

D4

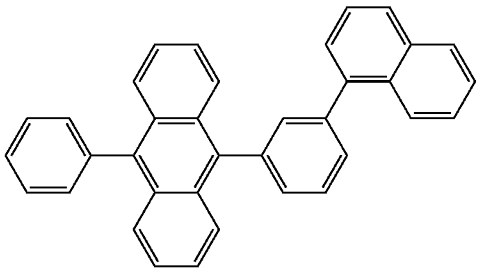

D5

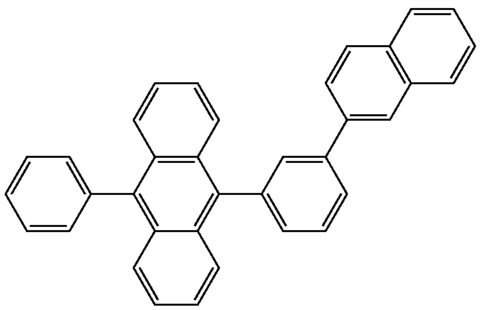

-continued
D6
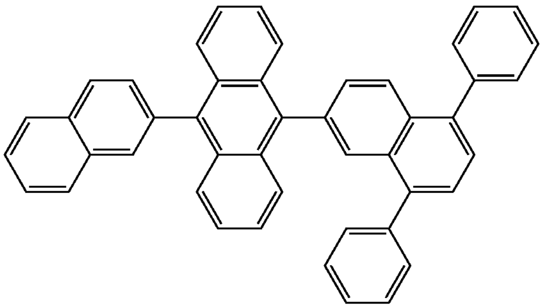
D7
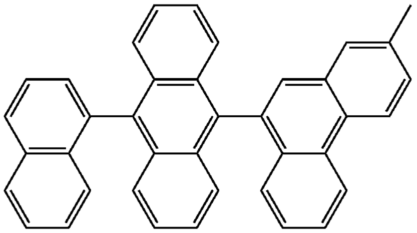
D8
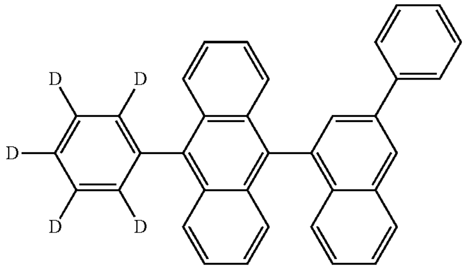
D9
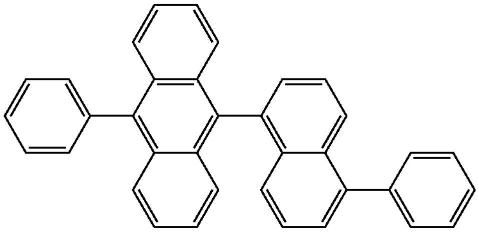
D10
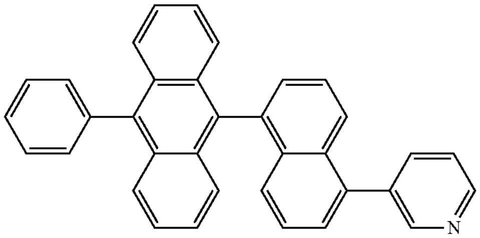
D11
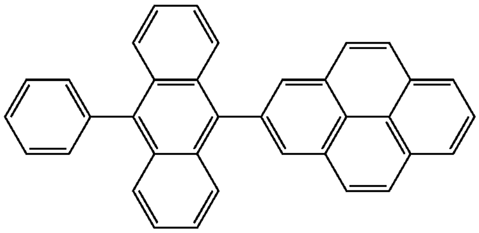
-continued
D12
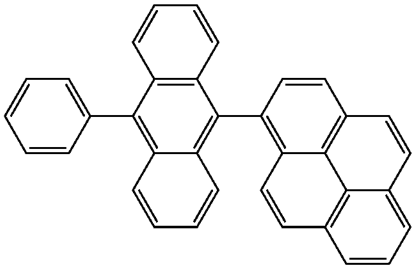
D13
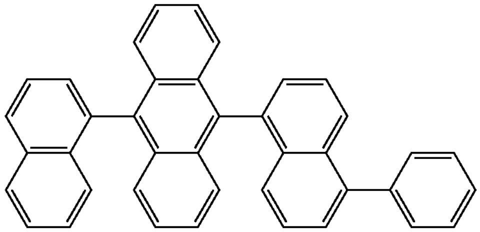
D14
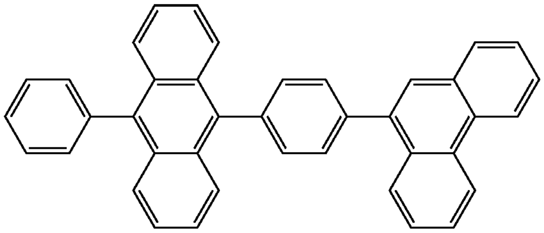
D15
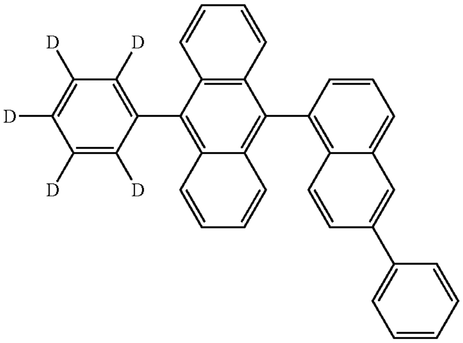
D16
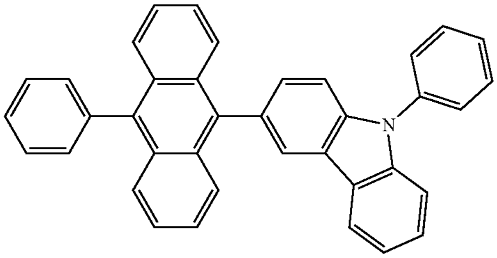

-continued
D17
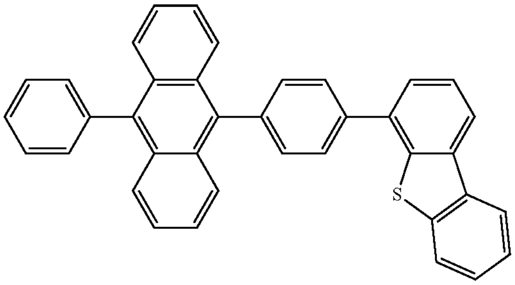
D18
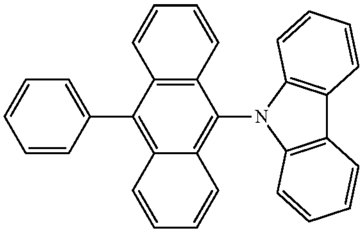
D19
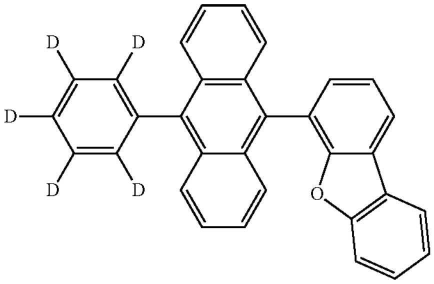
D20
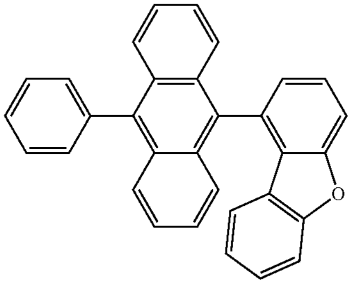
D21
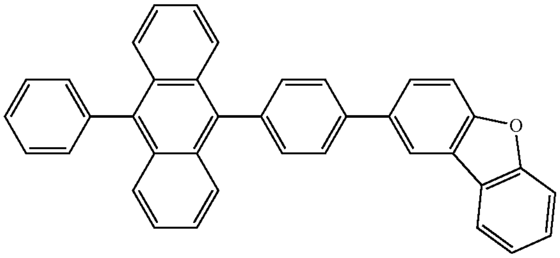
-continued
D22
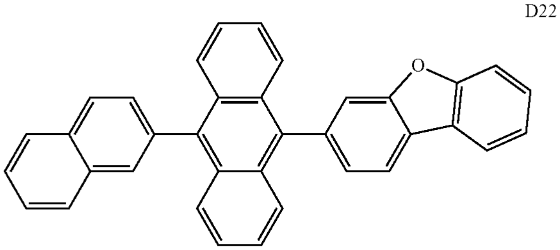
D23
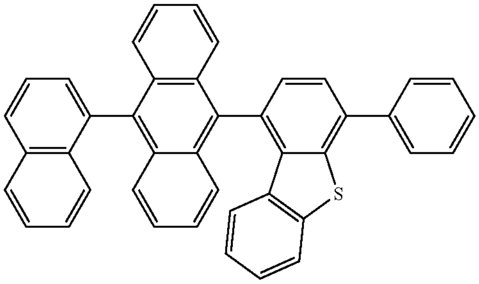
D24
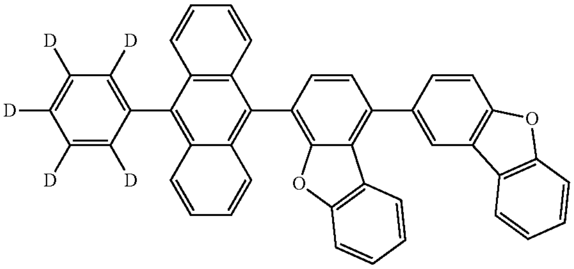
D25
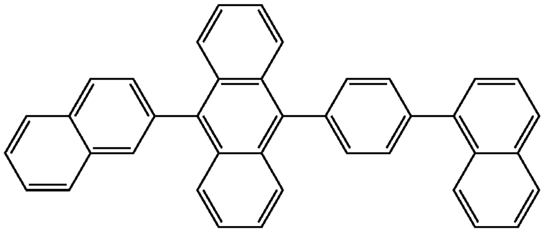
D26
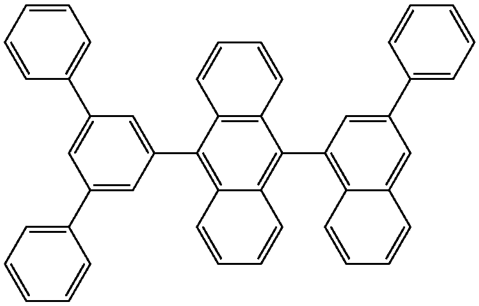

-continued
D27
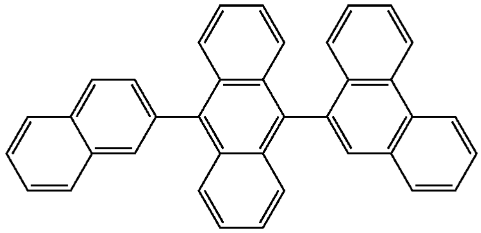
D28
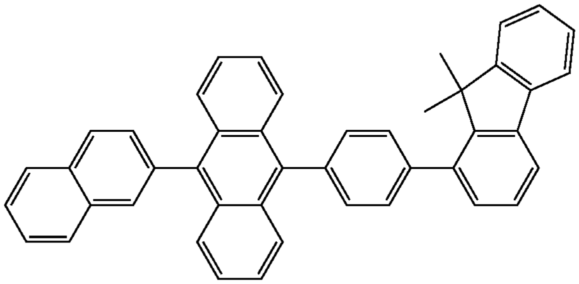
D29
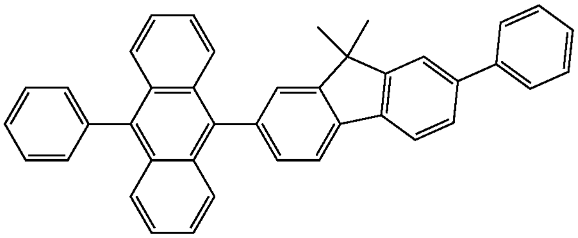
D30
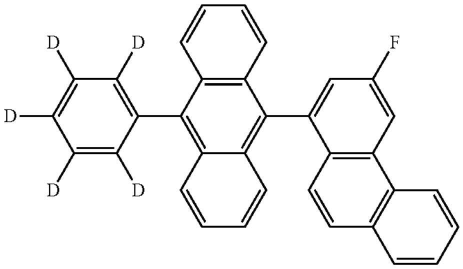
D31
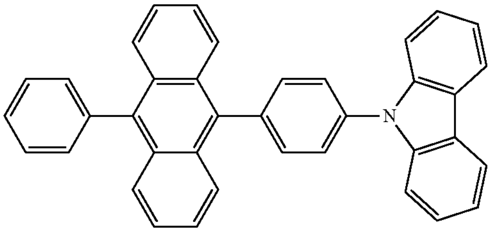
D32
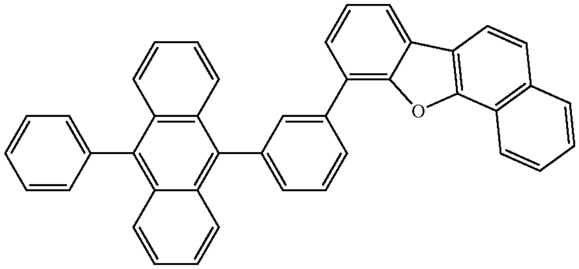
-continued
D33
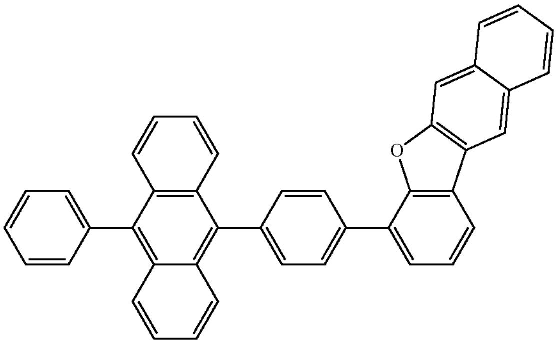
D34
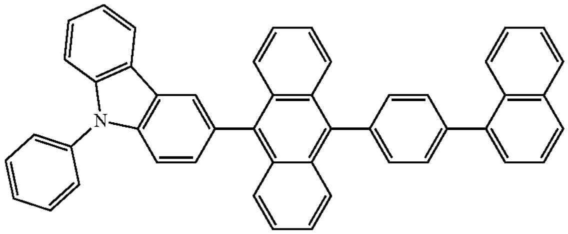
D35
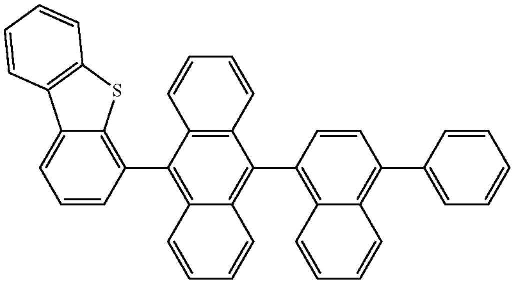
D36
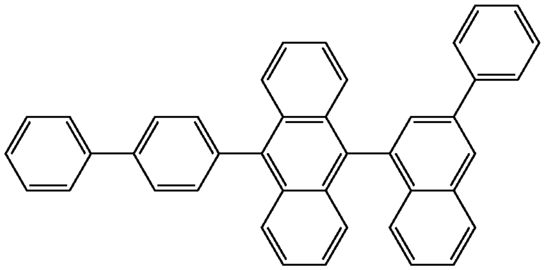
D37
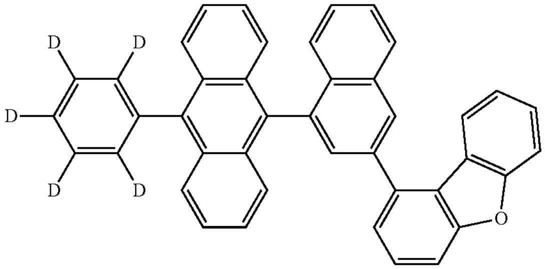

-continued
D38
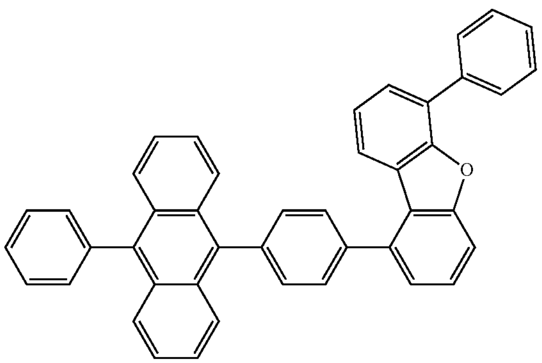
D39
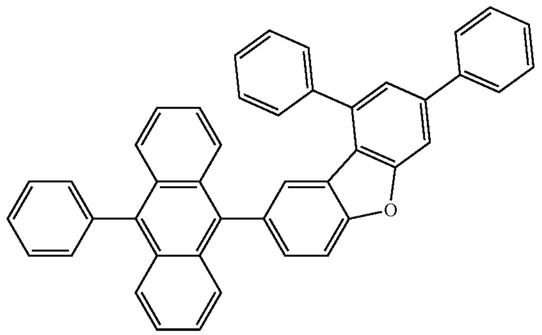
D40
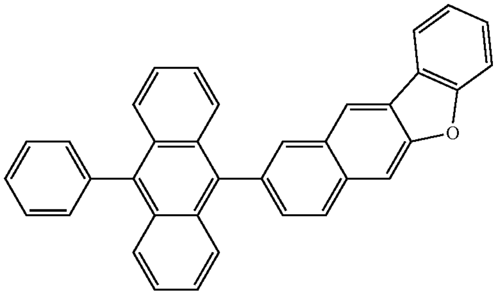
D41
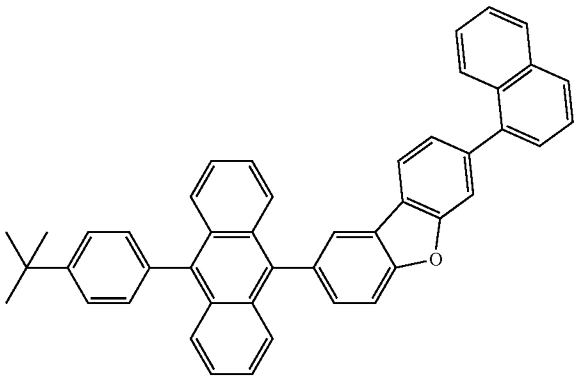
-continued
D42
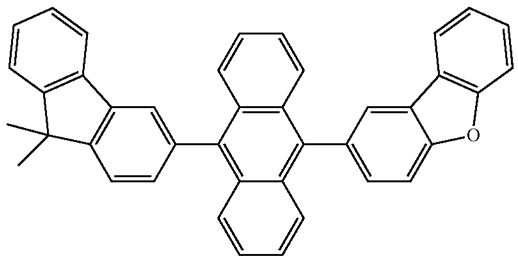
D43
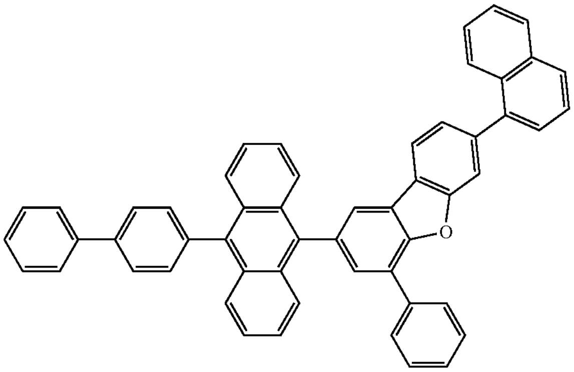
D44
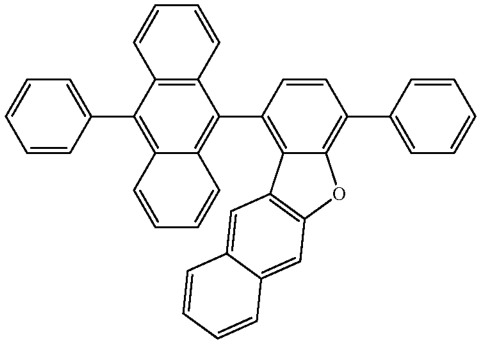
D45
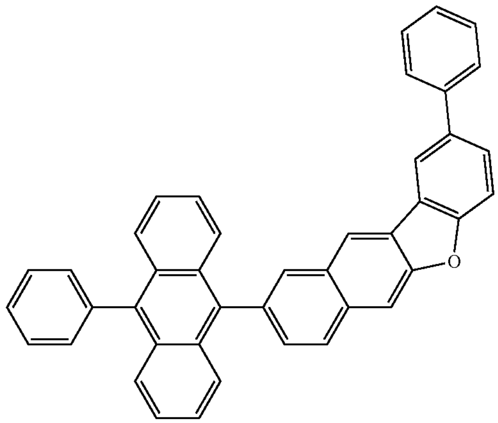

-continued

D46

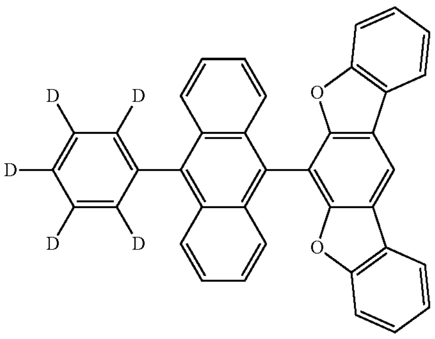

D47

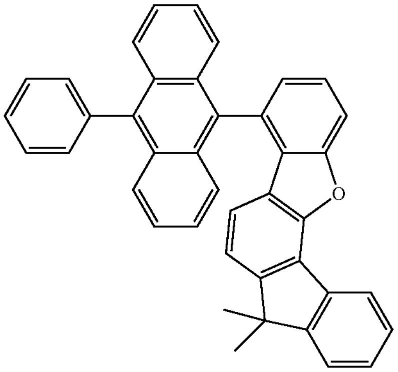

D48

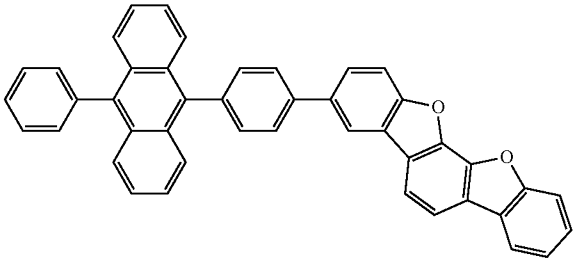

A specific structure of the organic electroluminescent device according to one embodiment of the present invention and a method for fabricating the device are as follows.

First, an anode material is coated on a substrate to form an anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zine oxide (IZO), tin oxide (SnO2) or zine oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited so long as it is usually used in the art. Specific examples of such materials include 4,4',4"-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), and N,N'-diphenyl-N,N'-bis(4-(phenyl-m-tolylamino)phenyl) biphenyl-4,4'-diamine (DNTPD).

The hole transport material is not specially limited so long as it is commonly used in the art. Examples of such materials include N,N'-bis(3-methylphenyl)-N,N'-diphenyl-(1,1-biphenyl)-4,4'-diamine (TPD) and N,N'-di(naphthalen-1-yl)-N,N'-diphenylbenzidine (α-NPD).

Subsequently, a hole auxiliary layer and a light emitting layer are sequentially laminated on the hole transport layer. A hole blocking layer may be optionally formed on the light emitting layer by vacuum thermal evaporation or spin coating. The hole blocking layer is formed as a thin film and blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited so long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, BeBq2, OXD-7, and Liq.

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum (Al), aluminum-lithium (Al—Li), calcium (Ca), magnesium-indium (Mg—In) or magnesium-silver (Mg—Ag) may be used as the metal for the formation of the cathode. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, Balq, beryllium bis(benzoquinolin-10-olate (Bebg2), ADN, and oxadiazole derivatives such as PBD, BMD, and BND.

Each of the organic layers can be formed by a monomolecular deposition or solution process. According to the monomolecular deposition process, the material for each layer is evaporated into a thin film under heat and vacuum or reduced pressure. According to the solution process, the material for each layer is mixed with a suitable solvent, and then the mixture is formed into a thin film by a suitable method, such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

MODE FOR CARRYING OUT THE INVENTION

The present invention will be explained more specifically with reference to the following examples. However, it will be obvious to those skilled in the art that these examples are in no way intended to limit the scope of the invention.

Synthesis Example 1: Synthesis of Compound 1

(1) Synthesis of Intermediate 3

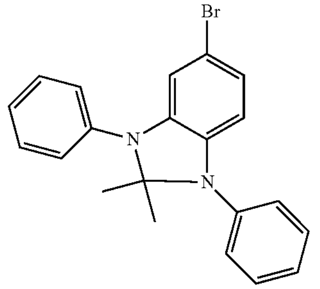

Intermediate 1

+

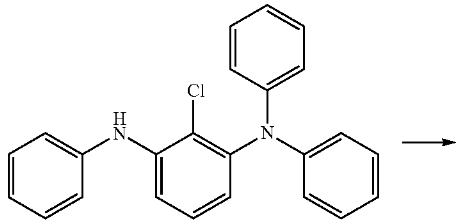

Intermediate 2

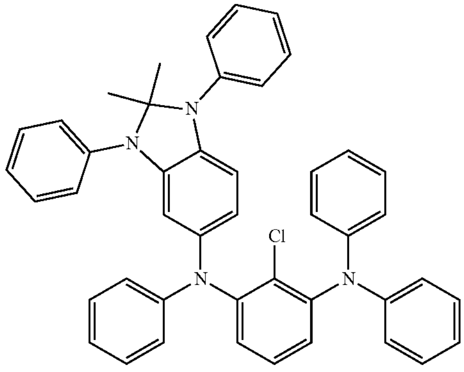

Intermediate 3

20.0 g of Intermediate 1 (see Chinese Patent Publication No. 107759527 for synthesis), 19.6 g of Intermediate 2 (see Angewandte Chemie-International Edition 2017 vol. 56# 18p. 5087-5090 for synthesis), 0.54 g of bis(tri-tert-butylphosphine)palladium(0), 10.1 g of sodium tert-butoxide, and 200 mL of toluene were placed in a reactor. The mixture was stirred under reflux for 12 h. The reaction mixture was cooled to room temperature and ethyl acetate and water were added thereto. The organic layer was separated and purified by silica gel chromatography to afford 29.4 g of Intermediate 3 (yield 83.3%).

MS (ESI) calcd. for Chemical Formula: $C_{45}H_{38}ClN_4$ (Pos) 669.27, found 669.2

(2) Synthesis of Compound 1

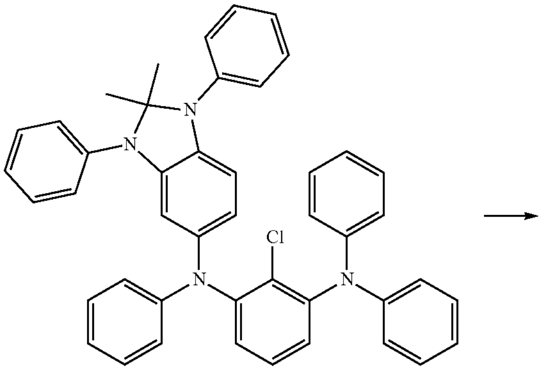

Intermediate 3

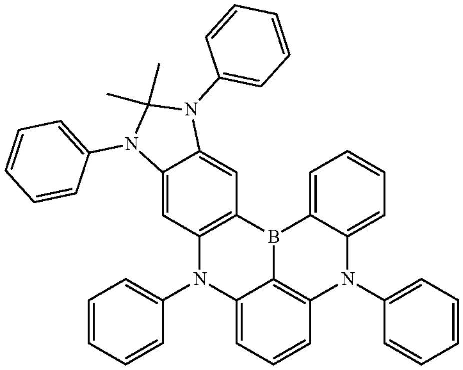

Compound 1

29.4 g of Intermediate 3 and 294 mL of tert-butylbenzene were placed in a reactor, and then 51.7 mL of 1.7 M tert-butyllithium was added dropwise thereto at −78° C. The mixture was heated to 60° C., followed by stirring for 3 h. Then, nitrogen at 60° C. was blown into the mixture to remove pentane. After cooling to −78° C., 8.3 mL of boron tribromide was added dropwise. The resulting mixture was allowed to warm to room temperature, followed by stirring for 2 h. After cooling to 0° C., 15.3 mL of N,N-diisopropylethylamine was added dropwise. The mixture was heated to 120° C., followed by stirring for 12 h. The reaction mixture was cooled to room temperature and 72 mL of a 10% aqueous sodium acetate solution and ethyl acetate were added thereto. The organic layer was separated and purified by silica gel chromatography to afford Compound 1 (7.8 g, 27.6%).

MS (ESI) calcd. for Chemical Formula: $C_{45}H_{36}BN_4$ (Pos) 643.30, found 643.3

Synthesis Example 2: Synthesis of Compound 13

(1) Synthesis of Intermediate 5

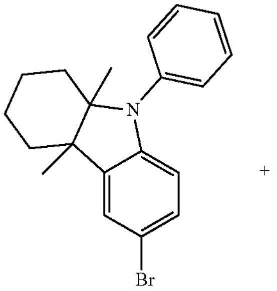

Intermediate 4

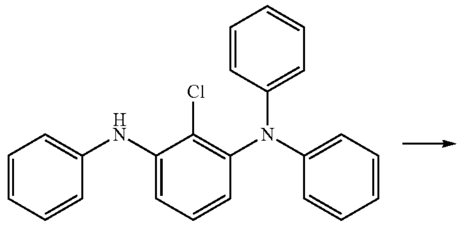

Intermediate 2

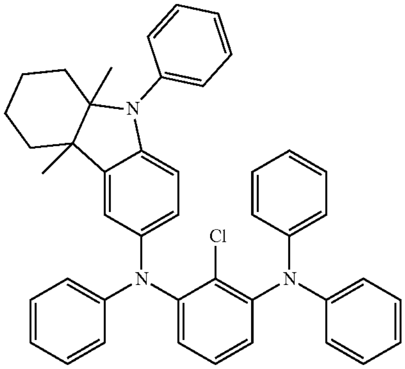

Intermediate 5

20.0 g of Intermediate 4 (see U.S. Pat. No. 9,815,821 for synthesis), 19.9 g of Intermediate 2, 0.55 g of bis(tri-tert-butylphosphine)palladium(0), 10.3 g of sodium tert-butoxide, and 200 mL of toluene were placed in a reactor. The mixture was stirred under reflux for 12 h. The reaction mixture was cooled to room temperature and ethyl acetate and water were added thereto. The organic layer was separated and purified by silica gel chromatography to afford 28.8 g of Intermediate 5 (yield 83.0%).

MS (ESI) calcd. for Chemical Formula: $C_{44}H_{41}ClN_3$ (Pos) 646.29, found 646.2

(2) Synthesis of Compound 13

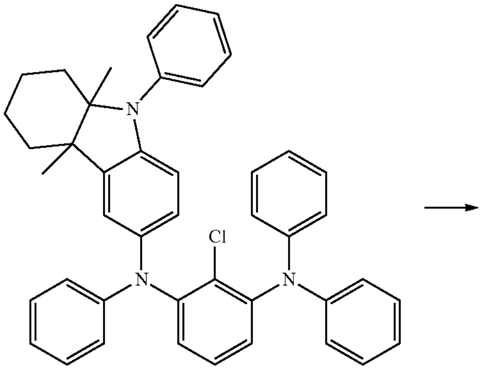

Intermediate 5

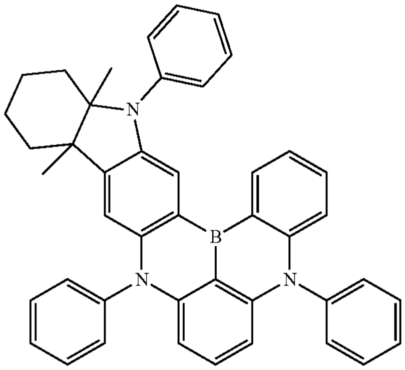

Compound 13

28.8 g of Intermediate 5 and 288 mL of tert-butylbenzene were placed in a reactor, and then 52.4 mL of 1.7 M tert-butyllithium was added dropwise thereto at −78° C. The mixture was heated to 60° C., followed by stirring for 3 h. Then, nitrogen at 60° C. was blown into the mixture to remove pentane. After cooling to −78° C., 8.5 mL of boron tribromide was added dropwise. The resulting mixture was allowed to warm to room temperature, followed by stirring for 2 h. After cooling to 0° C., 15.5 mL of N,N-diisopropylethylamine was added dropwise. The mixture was heated to 120° C., followed by stirring for 12 h. The reaction mixture was cooled to room temperature and 73 mL of a 10% aqueous sodium acetate solution and ethyl acetate were added thereto. The organic layer was separated and purified by silica gel chromatography to afford Compound 13 (6.9 g, 25.0%).

MS (ESI) calcd. for Chemical Formula: $C_{45}H_{36}BN_4$ (Pos) 643.30, found 643.3

Synthesis Example 3: Synthesis of Compound 11
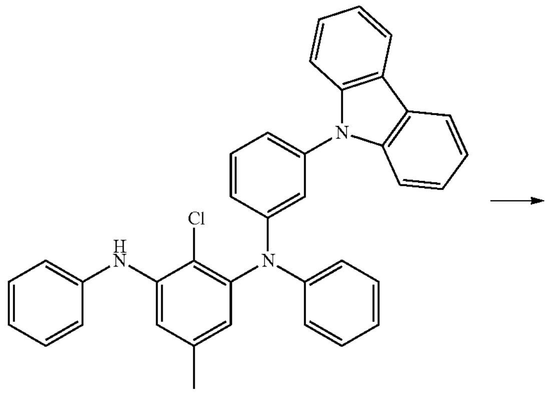
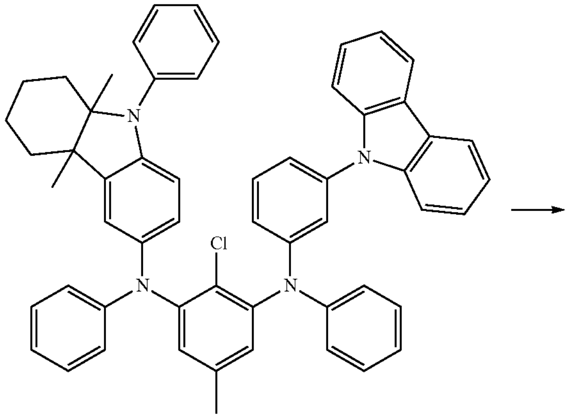
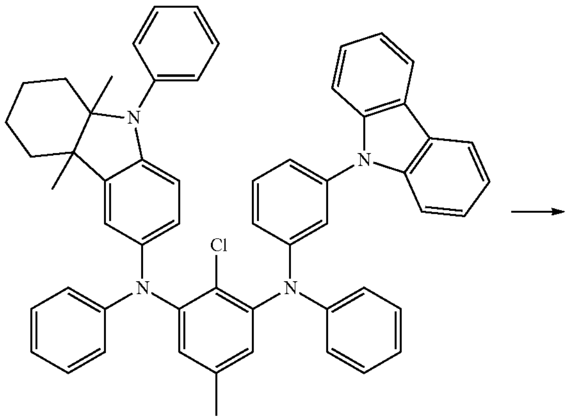
-continued
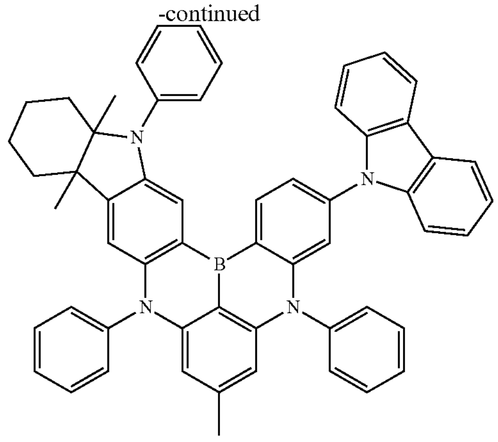
3.7 g of Compound 11 (final yield 19.4%) was synthesized in a similar manner to in Synthesis Example 2.
MS (ESI) calcd. for Chemical Formula: $C_{57}H_{48}BN_4$ (Pos) 799.40, found 799.4
Synthesis Example 4: Synthesis of Compound 89
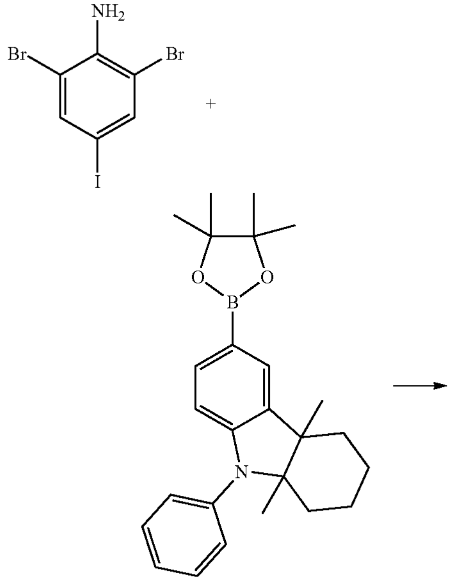
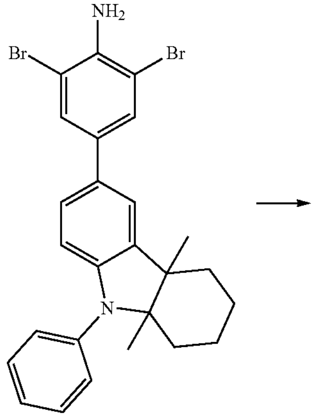

-continued

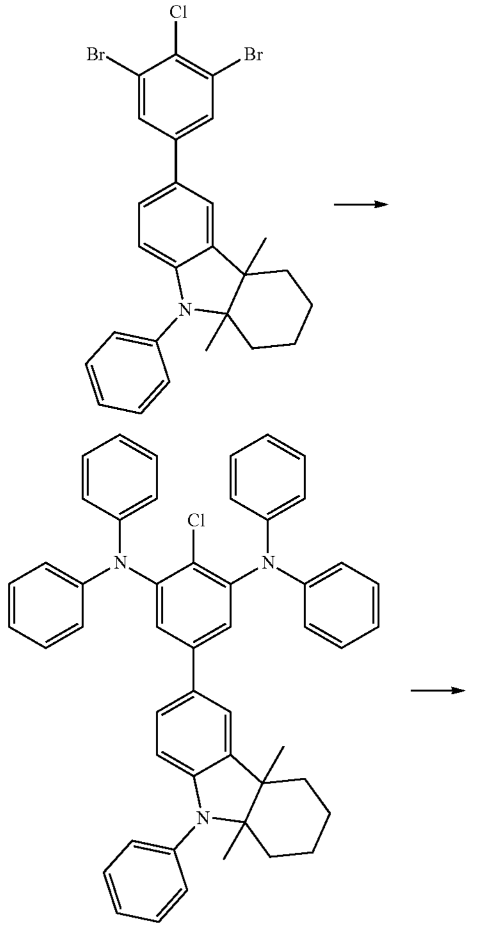

Intermediate 6

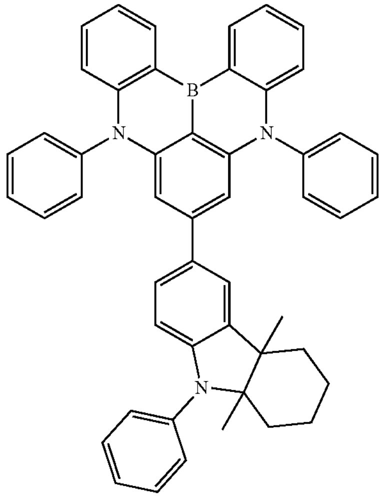

Intermediate 7

Intermediate 6 was synthesized with reference to Journal of Materials Chemistry (2007), 17(19), 1969-1980 and WO2019132040. Intermediate 7 was synthesized from Intermediate 6 with reference to Advanced Materials, 2016, vol. 28, 14, p. 2777-2781. 3.6 g of Compound 89 (final yield 22.1%) was synthesized from Intermediate 7 in the same manner as in Synthesis Example 2.

MS (ESI) calcd. for Chemical Formula: $C_{50}H_{43}BN_3$ (Pos) 696.36, found 696.3

Synthesis Example 5: Synthesis of Compound 90

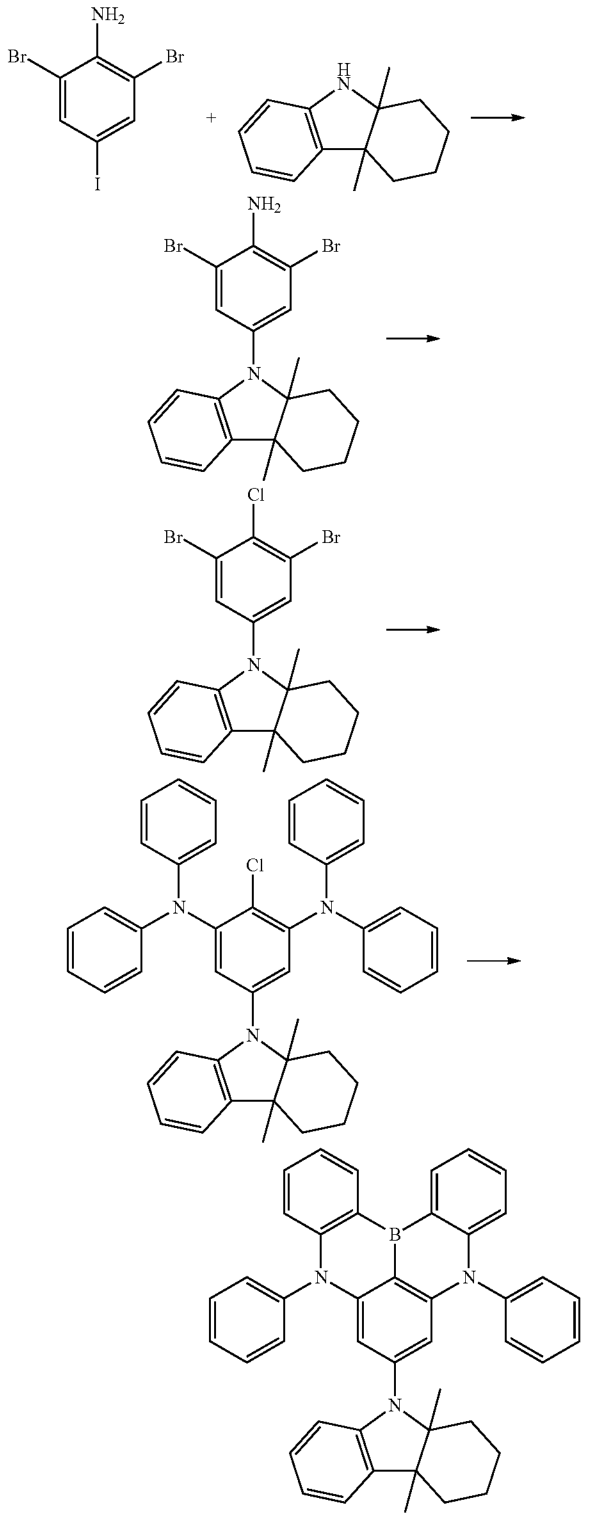

Intermediate 8

Intermediate 8 was synthesized with reference to Dyes and Pigments, 2017, vol. 143, p. 409-415. 2.7 g of Compound 90 (final yield 23.1%) was synthesized from Intermediate 8 in the same manner as in Synthesis Example 4.

MS (ESI) calcd. for Chemical Formula: $C_{44}H_{39}BN_3$ (Pos) 620.33, found 620.3

Synthesis Example 6: Synthesis of Compound 91

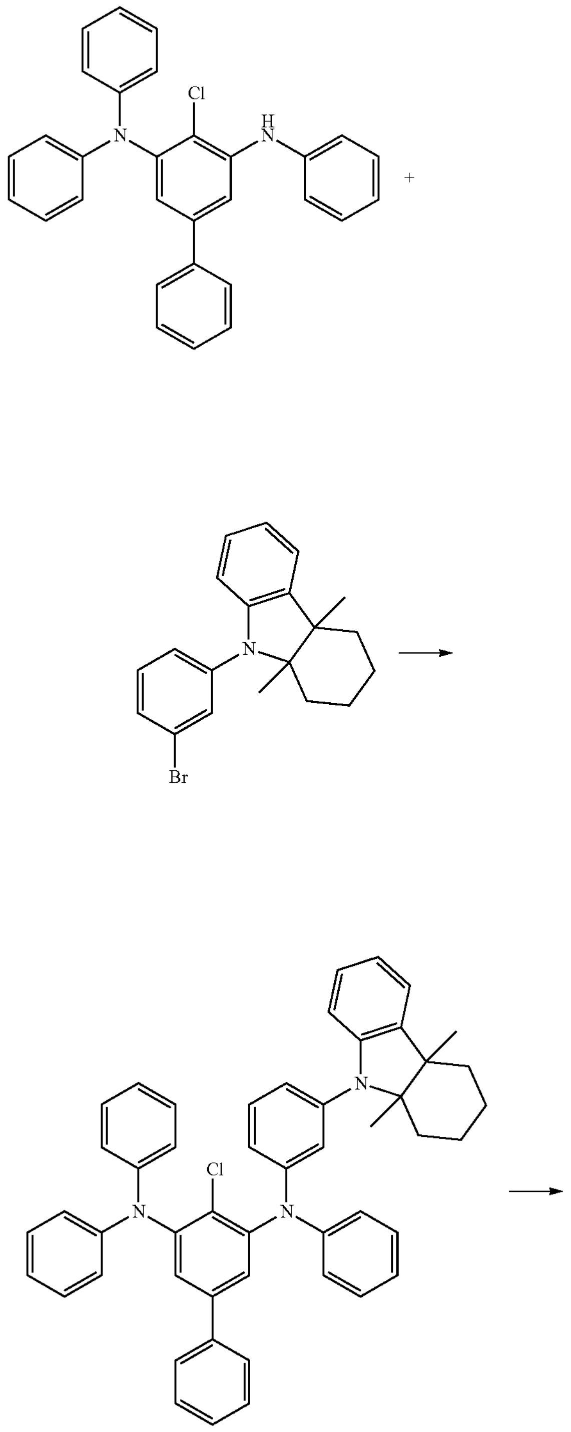

-continued

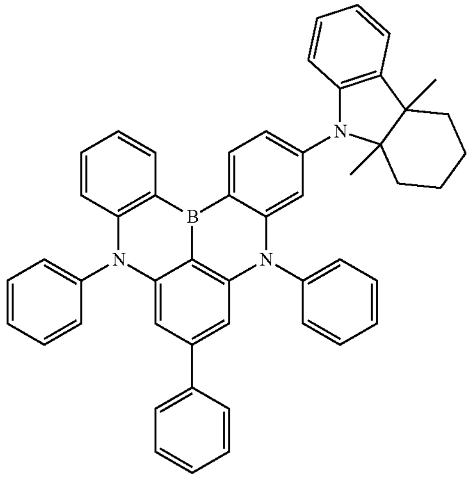

Intermediate 9

Intermediate 9 was synthesized with reference to Angewandte Chemie—International Edition 2017 vol. 56 18p. 5087-5090. 5.2 g of Compound 91 (final yield 20.1%) was synthesized from Intermediate 9 in the same manner as in Synthesis Example 1.

MS (ESI) calcd. for Chemical Formula: $C_{50}H_{43}BN_3$ (Pos) 696.36, found 696.3

Synthesis Example 7: Synthesis of Compound 97

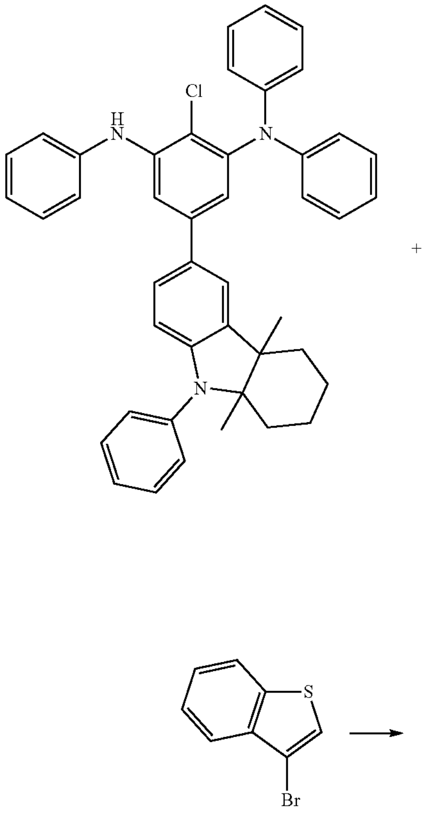

-continued

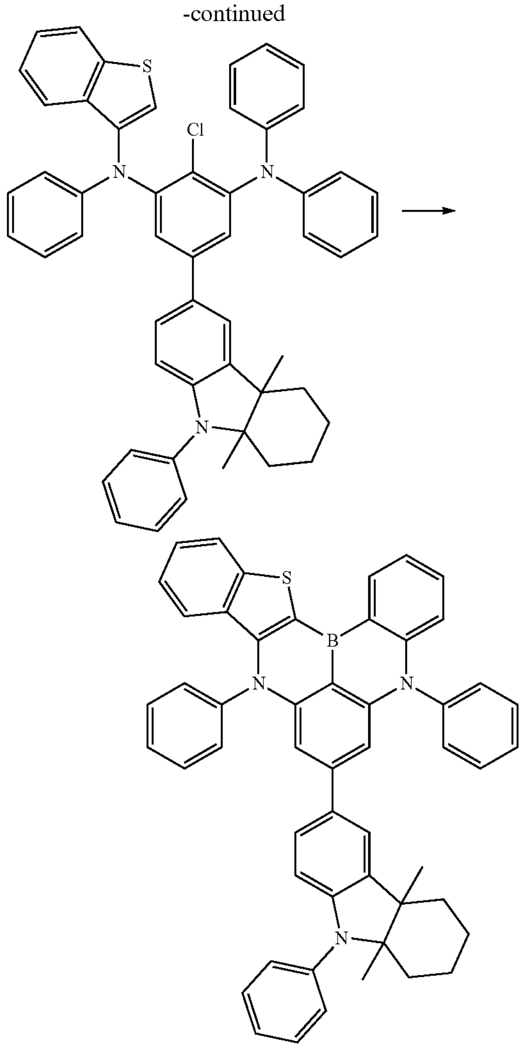

Intermediate 10

Intermediate 10 was synthesized from Intermediate 6 with reference to Angewandte Chemie—International Edition 2017 vol. 56 18p. 5087-5090. 3.3 g of Compound 97 (final yield 20.3%) was synthesized from Intermediate 10 in the same manner as in Synthesis Example 1.

MS (ESI) calcd. for Chemical Formula: $C_{52}H_{43}BN_3S$ (Pos) 752.33, found 752.3

Examples 1-11: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. HATCN (700 Å) and the compound represented by Formula F (250 Å) were deposited in this order on the ITO. A mixture of the host represented by BH1 and the inventive compound (3 wt %) shown in Table 1 was used to form a 250 Å thick light emitting layer. Thereafter, a mixture of the compound represented by Formula E-1 and the compound represented by Formula E-2 in a ratio of 1:1 was used to form a 300 Å thick electron transport layer on the light emitting layer. The compound represented by Formula E-1 was used to form a 5 Å thick electron injecting layer on the electron transport layer. Al was used to form a 1000 Å thick Al electrode on the electron injecting layer, completing the fabrication of an organic electroluminescent device. The luminescent properties of the organic electroluminescent device were measured at 0.4 mA.

[HATCN]

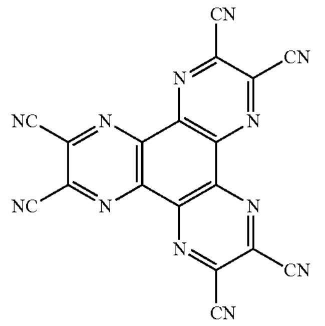

[Formula F]

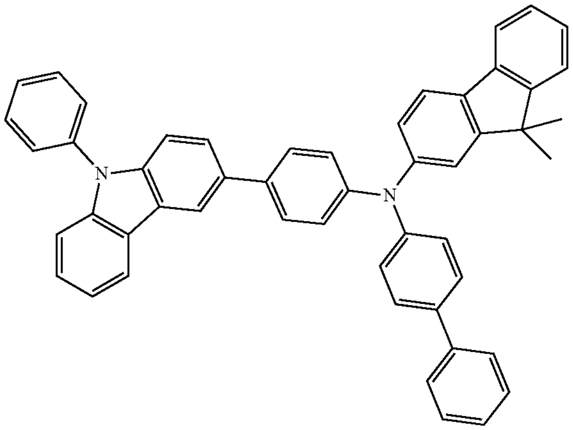

[Formula E-1]

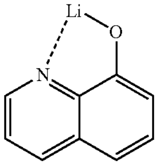

[Formula E-2]

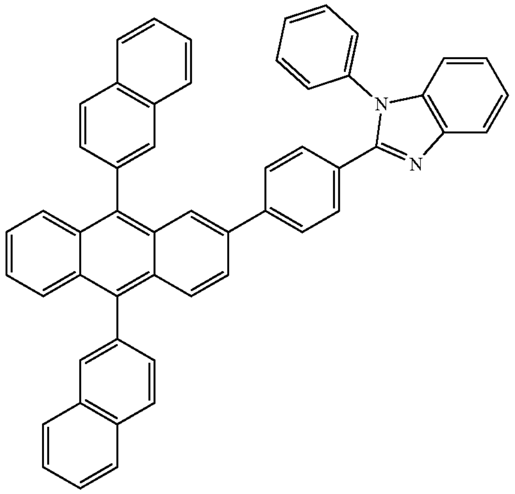

-continued

[BH1]

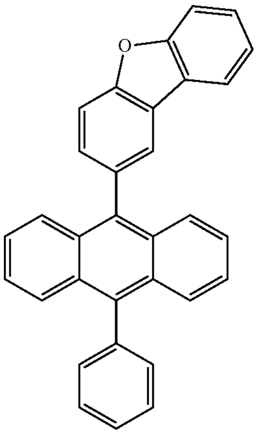

Comparative Examples 1-2

Organic electroluminescent devices were fabricated in the same manner as in Examples 1-11, except that BD1 or BD2 was used instead of the inventive compound. The luminescent properties of the organic electroluminescent devices were measured at 0.4 mA. The structures of BD1 and BD2 are as follow:

[BD1]

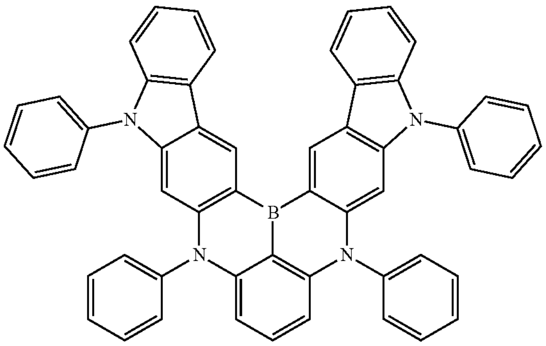

[BD2]

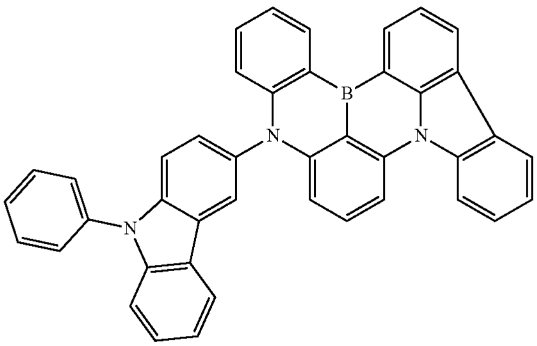

The organic electroluminescent devices of Examples 1-11 and Comparative Examples 1-2 were measured for voltage, efficiency, and lifetime. The results are shown in Table 1.

TABLE 1

| Example No. | Dopant | Driving voltage (V) | Efficiency (Cd/A) | Lifetime (LT97) |
|---|---|---|---|---|
| Example 1 | Compound 13 | 3.7 | 6.7 | 120 |
| Example 2 | Compound 21 | 3.8 | 6.8 | 83 |
| Example 3 | Compound 23 | 3.8 | 7.1 | 132 |
| Example 4 | Compound 46 | 3.8 | 6.4 | 109 |
| Example 5 | Compound 65 | 3.7 | 6.5 | 75 |
| Example 6 | Compound 89 | 3.8 | 7.0 | 100 |
| Example 7 | Compound 90 | 3.8 | 7.5 | 105 |
| Example 8 | Compound 91 | 3.8 | 7.1 | 113 |
| Example 9 | Compound 94 | 3.8 | 6.6 | 130 |
| Example 10 | Compound 97 | 3.8 | 7.0 | 110 |
| Example 11 | Compound 105 | 3.7 | 7.3 | 125 |
| Comparative Example 1 | BD1 | 3.8 | 6.1 | 51 |
| Comparative Example 2 | BD2 | 3.8 | 6.2 | 42 |

As can be seen from the results in Table 1, the organic electroluminescent devices of Examples 1-11, each of which employed the inventive compound, had high efficiencies and significantly improved life characteristics compared to the devices of Comparative Examples 1-2.

The invention claimed is:

1. A compound represented by Formula B or C:

[Formula B]

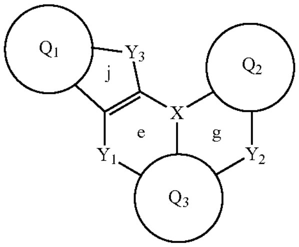

[Formula C]

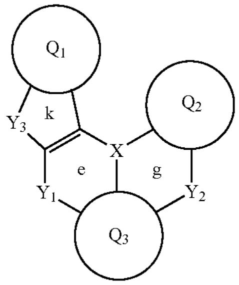

wherein $Q_1$ to $Q_3$ are identical to or different from each other and are each independently a 3- to 8-membered monocyclic or polycyclic substituted or unsubstituted aliphatic, aromatic or non-aromatic ring containing at least one hydrocarbon or heteroatom, each X is independently selected from B, $SiR_2$, P, P═O, and P═S, $Y_1$ and $Y_2$ are Y-2 of the following structure:

(Y-2)

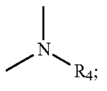

$Y_3$ is Y-2 or Y-10 of the following structures:

(Y-2)

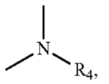

(Y-10)

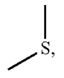

and $R_2$ and $R_4$ are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, substituted or unsubstituted $C_1$-$C_{30}$ non-aromatic rings, and a structure represented by Formula W:

[Formula W]

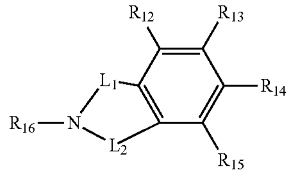

wherein $L_1$ and $L_2$ are identical to or different from each other and are each independently a substituted or unsubstituted aliphatic linker containing at least one hydrocarbon or heteroatom or a single bond, and $R_{12}$ to $R_{16}$ are as defined for $R_2$ and $R_4$ except that (1) two adjacent ones of $R_{12}$ to $R_{15}$ are optionally combined with the ring j, g or e to form $Q_1$ to $Q_3$ in Formula B or are optionally combined with the ring k, g or e to form $Q_1$ to $Q_3$ in Formula C, and (2) $L_1$ and $L_2$ or one of $R_{12}$ to Rie are optionally bonded to $Q_1$ to $Q_3$, $R_2$ or $R_4$, with the proviso that each of the compounds represented by Formula B or C contains at least one structure represented by Formula W and that each of $R_2$, $R_4$, and $R_{12}$ to $R_{16}$, $Q_1$ to $Q_3$, $L_1$, $L_2$, and their substituents optionally forms a substituted or unsubstituted ring with an adjacent substituent, and wherein the compound represented by Formula B represented by Formula B-3:

[Formula B-3]

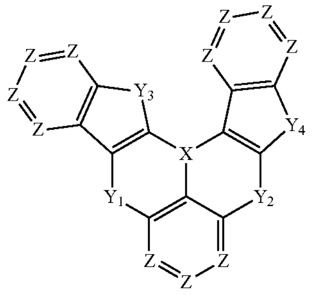

wherein $Y_4$ is Y-2 or Y-10 of the following structures:

(Y-2)

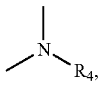

(Y-10)

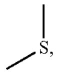

and wherein the moieties Z are identical to or different from each other and are each independently CR or N, the groups R are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, substituted or unsubstituted $C_1$-$C_{30}$ non-aromatic rings, the structure represented by Formula W, and halogen.

2. The compound according to claim 1, wherein at least one of $Q_1$ to $Q_3$ in Formula B or C contains the structure represented by Formula W.

3. The compound according to claim 1, wherein $Y_1$ to $Y_3$ or one or more of $Q_1$ to $Q_3$ in Formula B or C are connected to the structure represented by Formula W to form a substituted structure.

4. The compound according to claim 1, wherein $R_2$ and $R_4$ are each independently selected from the group consisting of substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, and substituted or unsubstituted $C_1$-$C_{50}$ heteroaryl.

5. The compound according to claim 1, wherein the compound represented by C is selected from the group consisting of the compounds represented by Formulae C-1 and C-2:

[Formula C-1]

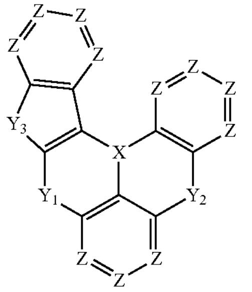

[Formula C-2]

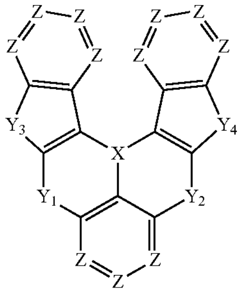

wherein $Y_4$ is Y-2 or Y-10 of the following structures:

(Y-2)

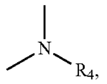

(Y-10)

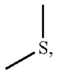

and wherein the moieties Z are identical to or different from each other and are each independently CR or N, the groups R are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, substituted or unsubstituted $C_1$-$C_{30}$ non-aromatic rings, the structure represented by Formula W, and halogen.

6. An organic electroluminescent device comprising a first electrode, a second electrode opposite to the first electrode, and one or more organic layers interposed between the first and second electrodes wherein one of the organic layers comprises at least one of the compounds represented by Formulae B and C of claim 1.

7. The organic electroluminescent device according to claim 6, wherein the one or more organic layers comprise an electron injecting layer, an electron transport layer, a hole injecting layer, a hole transport layer, an electron blocking layer, a hole blocking layer, and/or a light emitting layer, at least one of which comprises at least one of the compounds represented by Formulae B and C.

8. The organic electroluminescent device according to claim 6, wherein the light emitting layer comprises at least one of the compounds represented by Formulae B and C.

9. The organic electroluminescent device according to claim 7, wherein the one or more organic layers are formed by a deposition or solution process.

10. A compound represented by Formula A-1:

[Formula A-1]

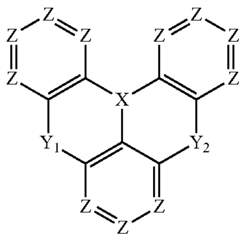

wherein each X is selected from the group consisting of B, $SiR_2$, P, P=O, and P=S, $Y_1$ and $Y_2$ are Y-2 of the following structure:

(Y-2)

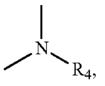

and $R_2$ and $R_4$ are identical to or different from each other and are each independently selected from hydrogen, deuterium, substituted or unsubstituted $C_1$-$C_{30}$ alkyl, $C_2$-$C_{24}$ alkenyl, $C_2$-$C_{24}$ alkynyl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, substituted or unsubstituted $C_1$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, substituted or unsubstituted $C_6$-$C_{30}$ arylsilyl, nitro, cyano, halogen, substituted or unsubstituted $C_1$-$C_{30}$ non-aromatic rings, and a structure represented by Formula W:

[Formula W]

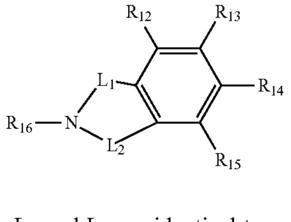

wherein $L_1$ and $L_2$ are identical to or different from each other and are each independently a substituted or unsubstituted aliphatic linker containing at least one hydrocarbon or heteroatom or a single bond, and $R_{12}$ to $R_{16}$ are as defined for $R_2$ and $R_4$, except that (1) two adjacent ones of $R_{12}$ to $R_{15}$ are optionally combined, and (2) $L_1$ and $L_2$ or one of $R_{12}$ to $R_{16}$ are optionally bonded to $R_2$ or $R_4$, with the proviso that the compound represented by Formula A-1 contains at least one structure represented by Formula W and that each of $R_2$, $R_4$, $R_{12}$ to $R_{16}$, $L_1$, $L_2$, and their substituents optionally forms a substituted or unsubstituted ring with an adjacent substituent, and wherein each Z are identical to or different from each other and are each independently CR or N, the groups R are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, substituted or unsubstituted $C_1$-$C_{30}$ non-aromatic rings, the structure represented by Formula W, and halogen, and wherein at least one of Z is N.

11. The compound according to claim 10, wherein $Y_1$ or $Y_2$ is connected to the structure represented by Formula W to form a substituted structure.

12. The compound according to claim 10, wherein $R_2$, $R_4$, and $R_{12}$ to $R_{16}$ are each independently selected from the group consisting of substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_1$-$C_{30}$ heterocycloalkyl, substituted or unsubstituted $C_1$-$C_{30}$ heteroalkyl, and substituted or unsubstituted $C_1$-$C_{50}$ heteroaryl.

13. An organic electroluminescent device comprising a first electrode, a second electrode opposite to the first electrode, and one or more organic layers interposed between the first and second electrodes wherein one of the organic layers comprises the compound represented by Formula A-1 of claim 10.

14. The organic electroluminescent device according to claim 13, wherein the one or more organic layers comprise an electron injecting layer, an electron transport layer, a hole injecting layer, a hole transport layer, an electron blocking layer, a hole blocking layer, and/or a light emitting layer, at least one of which comprises the compound represented by Formula A-1.

15. The organic electroluminescent device according to claim 13, wherein the light emitting layer comprises the compound represented by Formula A-1.

16. The organic electroluminescent device according to claim 14, wherein the one or more organic layers are formed by a deposition or solution process.

* * * * *